United States Patent
Shiino

(10) Patent No.: US 10,504,586 B2
(45) Date of Patent: Dec. 10, 2019

(54) SEMICONDUCTOR MEMORY DEVICE

(71) Applicant: Toshiba Memory Corporation, Minato-ku (JP)

(72) Inventor: Yasuhiro Shiino, Fujisawa (JP)

(73) Assignee: Toshiba Memory Corporation, Minato-ku (JP)

(*) Notice: Subject to any disclaimer, the term of this patent is extended or adjusted under 35 U.S.C. 154(b) by 0 days.

(21) Appl. No.: 15/908,449

(22) Filed: Feb. 28, 2018

(65) Prior Publication Data

US 2019/0088312 A1    Mar. 21, 2019

(30) Foreign Application Priority Data

Sep. 20, 2017 (JP) ................. 2017-180511

(51) Int. Cl.
| | |
|---|---|
| G11C 11/56 | (2006.01) |
| G11C 16/34 | (2006.01) |
| G11C 16/04 | (2006.01) |
| G11C 16/24 | (2006.01) |
| G11C 16/10 | (2006.01) |
| G11C 16/26 | (2006.01) |

(52) U.S. Cl.
CPC ...... G11C 11/5628 (2013.01); G11C 11/5671 (2013.01); G11C 16/0483 (2013.01); G11C 16/24 (2013.01); G11C 16/3459 (2013.01); G11C 16/10 (2013.01); G11C 16/26 (2013.01); G11C 16/3418 (2013.01)

(58) Field of Classification Search
CPC . G11C 11/5628; G11C 11/5671; G11C 16/10; G11C 16/24; G11C 16/26; G11C 16/3459; G11C 16/0483; G11C 16/3418

USPC ..................................... 365/185.03
See application file for complete search history.

(56) References Cited

U.S. PATENT DOCUMENTS

| | | | |
|---|---|---|---|
| 7,701,770 B2 | 4/2010 | Lee | |
| 8,233,324 B2 | 7/2012 | Sharon et al. | |
| RE46,665 E | * 1/2018 | Park | |
| 2009/0213652 A1 | * 8/2009 | Park | G11C 16/3418 365/185.03 |
| 2009/0267128 A1 | 10/2009 | Maejima | |
| 2009/0268522 A1 | 10/2009 | Maejima | |
| 2010/0135078 A1 | * 6/2010 | Iwai | G11C 11/5642 365/185.03 |
| 2010/0207195 A1 | 8/2010 | Fukuzumi et al. | |
| 2010/0214838 A1 | 8/2010 | Hishida et al. | |
| 2011/0284946 A1 | 11/2011 | Kiyotoshi | |

(Continued)

FOREIGN PATENT DOCUMENTS

JP        2014-225310        12/2014

*Primary Examiner* — Sung Il Cho
(74) *Attorney, Agent, or Firm* — Oblon, McClelland, Maier & Neustadt, L.L.P.

(57) ABSTRACT

According to one embodiment, a semiconductor memory device includes memory cells, a word line, bit lines, and a controller. The word line is connected to the memory cells. Each of the lines is connected to the memory cells. In a program operation, while applying a program voltage to the word line, the controller applies a first voltage to a bit line connected to memory cells to which a first data is to be written, applies a second voltage lower than the first voltage to a bit line connected to memory cells to which a second data is to be written, and applies a third voltage lower than the second voltage to a bit line connected to memory cells to which a third data is to be written.

20 Claims, 21 Drawing Sheets

(56) References Cited

U.S. PATENT DOCUMENTS

| | | |
|---|---|---|
| 2012/0069663 A1 | 3/2012 | Itagaki et al. |
| 2013/0301352 A1* | 11/2013 | Shim .................. G11C 16/10 |
| | | 365/185.03 |
| 2014/0233311 A1 | 8/2014 | Iwai et al. |
| 2014/0340964 A1 | 11/2014 | Shiino et al. |
| 2015/0262675 A1* | 9/2015 | Lin .................. G11C 16/3459 |
| | | 365/185.12 |
| 2017/0148520 A1* | 5/2017 | Oh .................. G11C 16/12 |
| 2017/0263327 A1* | 9/2017 | Lee .................. G11C 16/3459 |

* cited by examiner

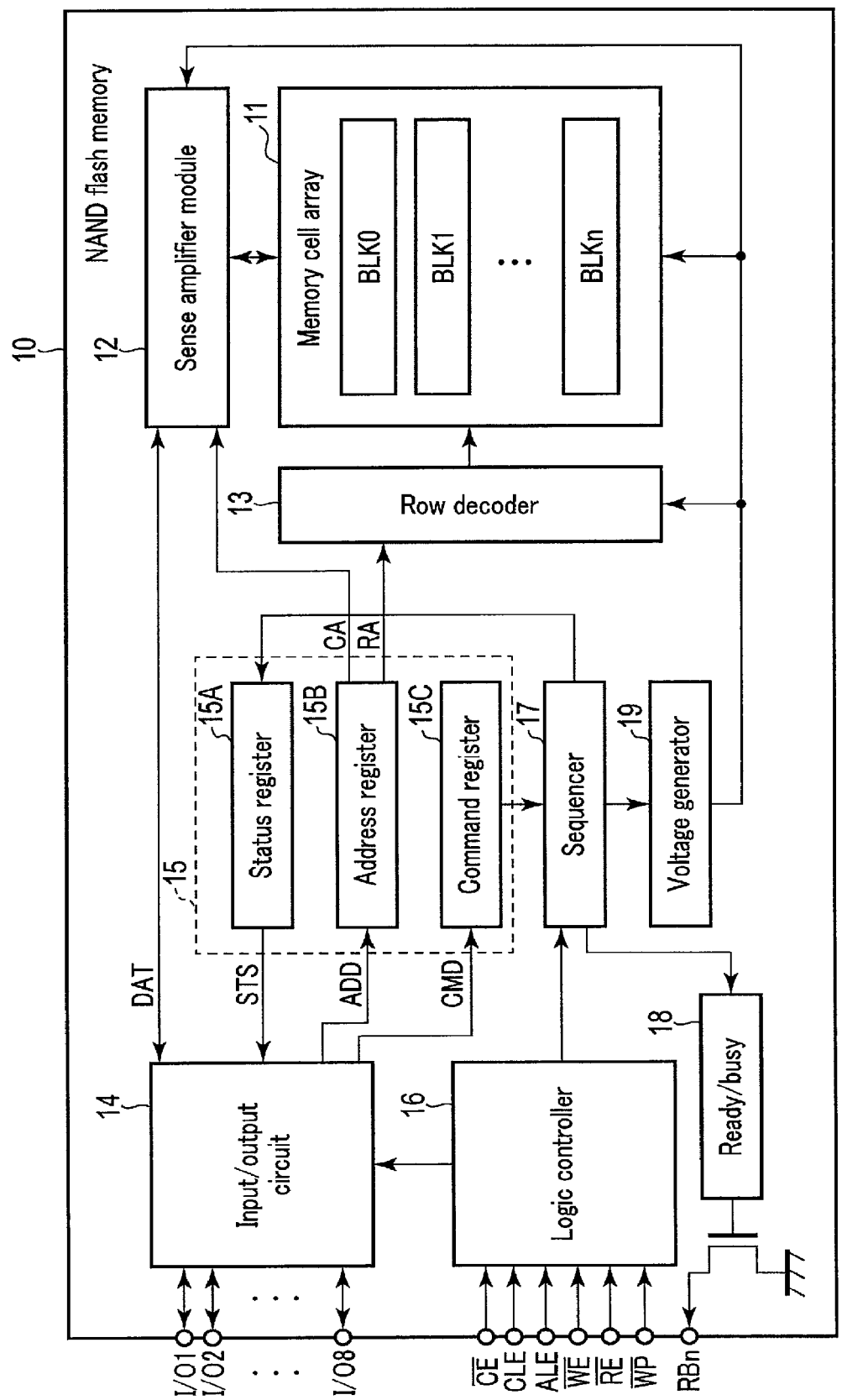
F I G. 1

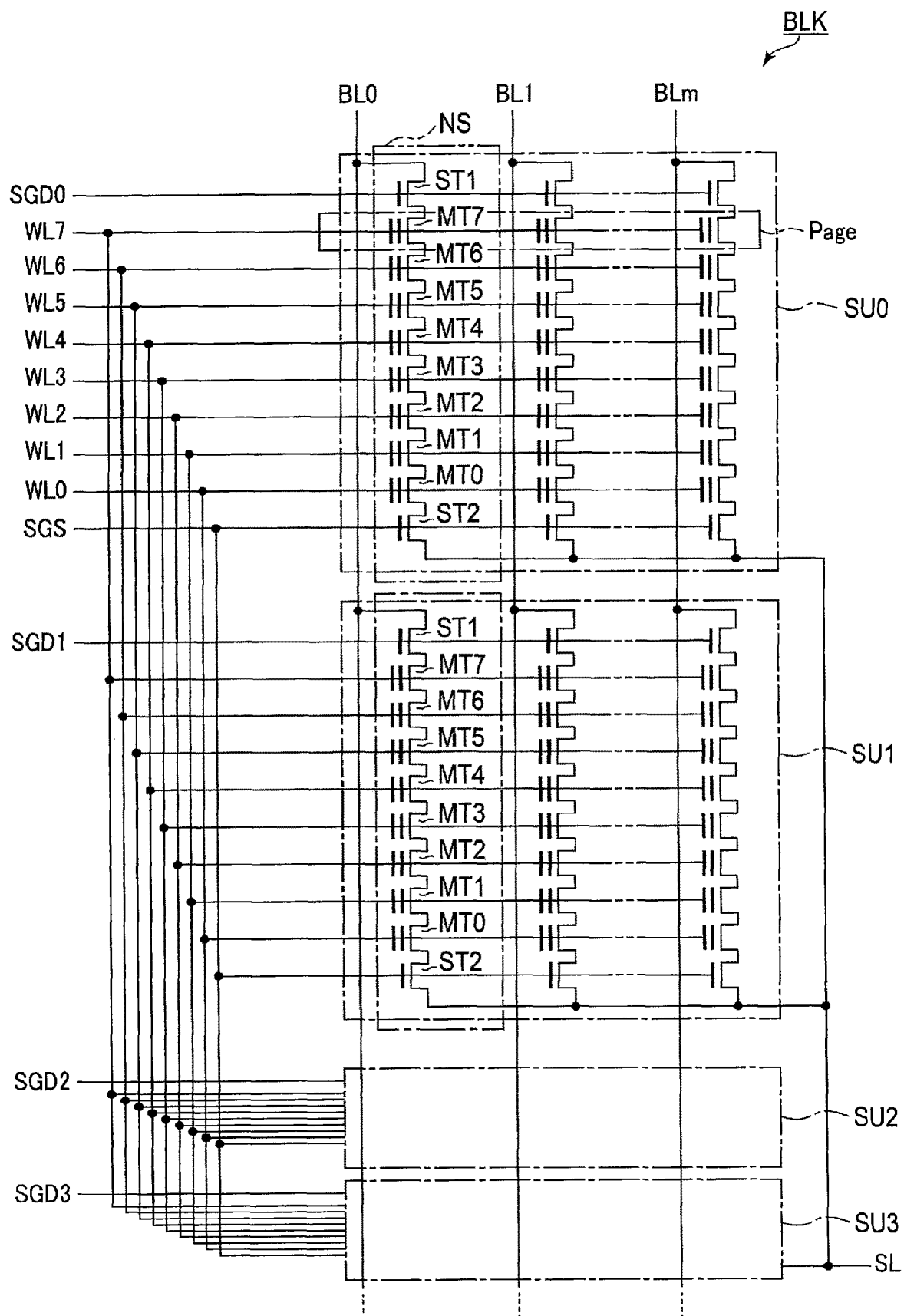
F I G. 2

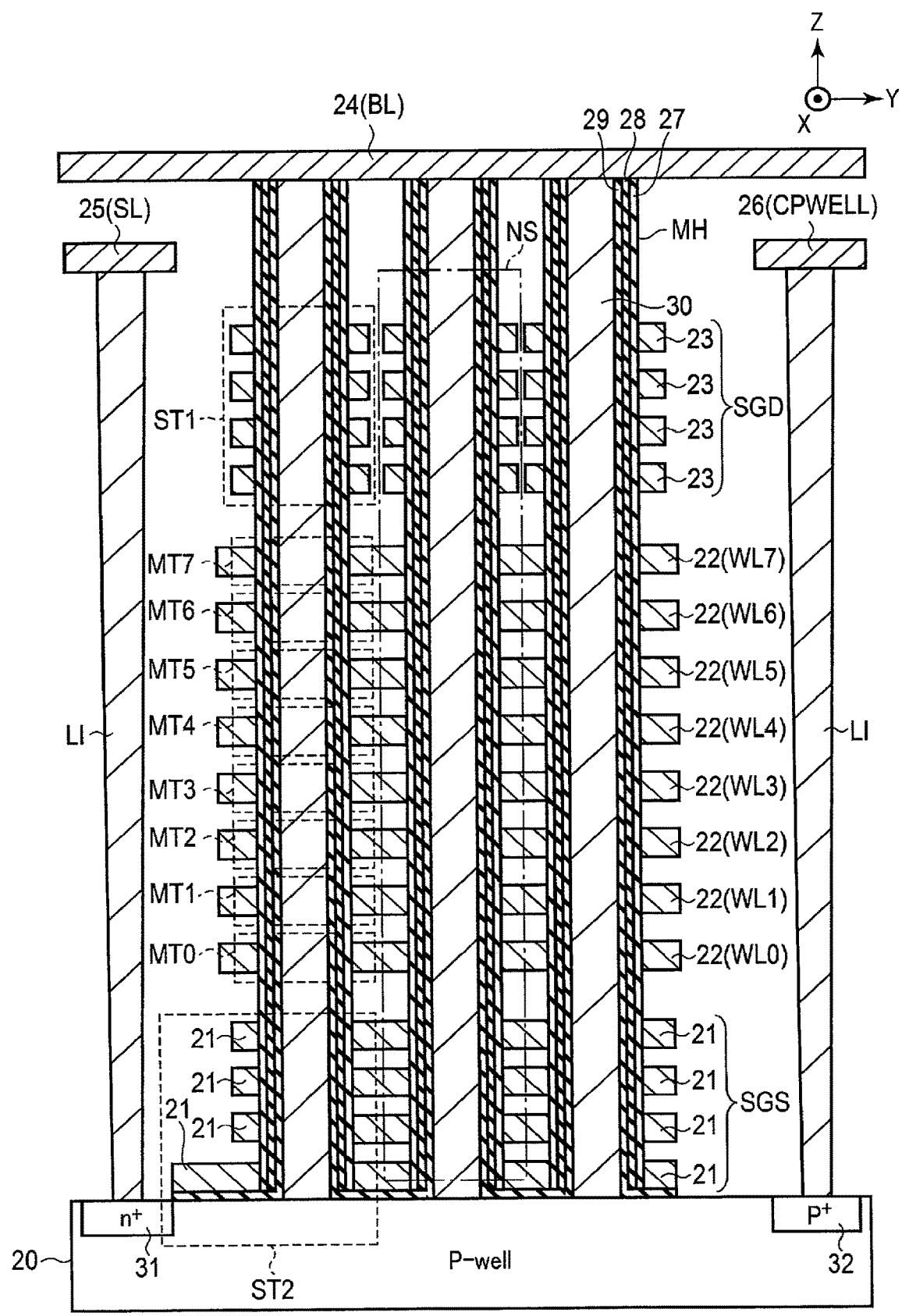
F I G. 4

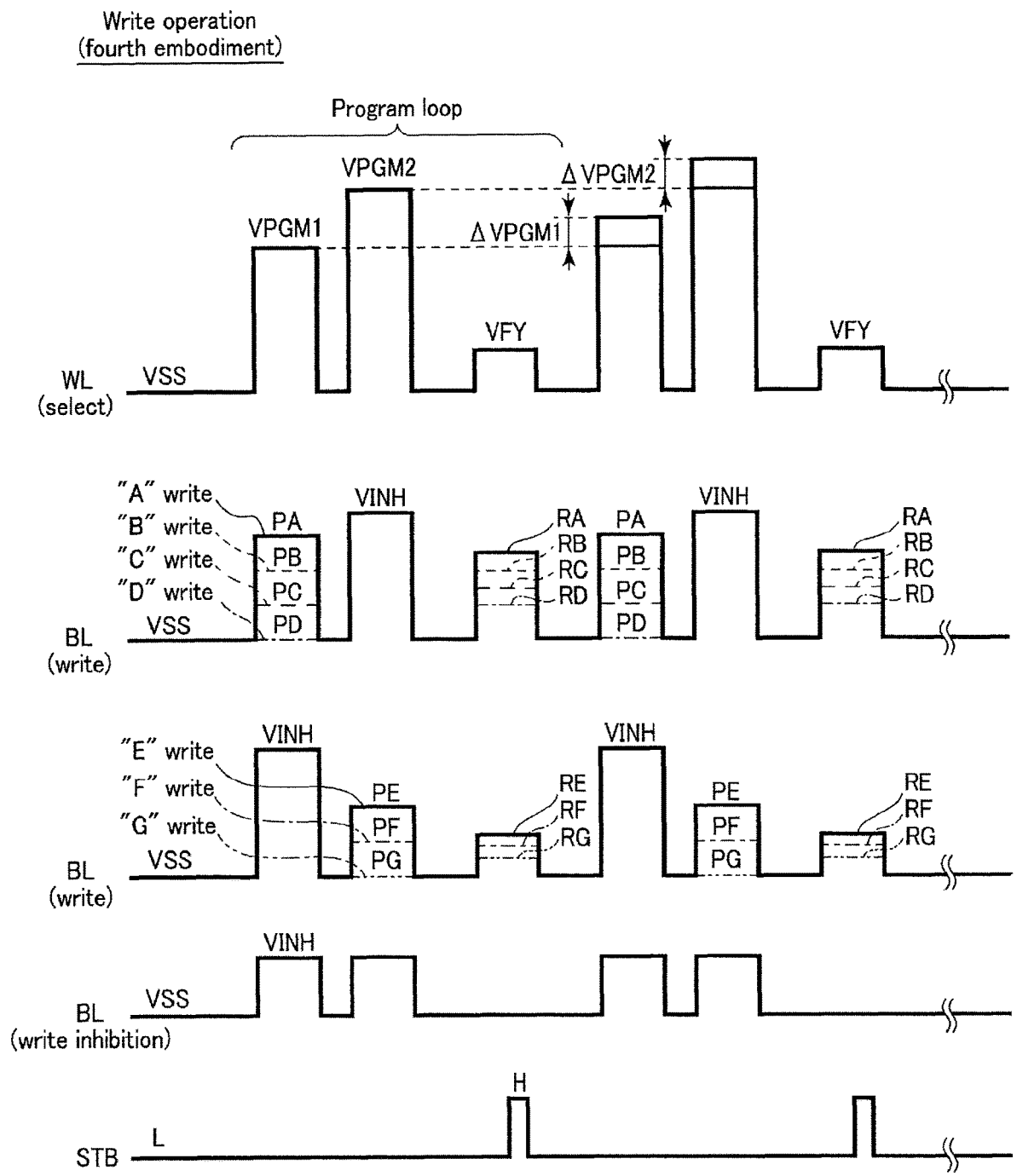
F I G. 12

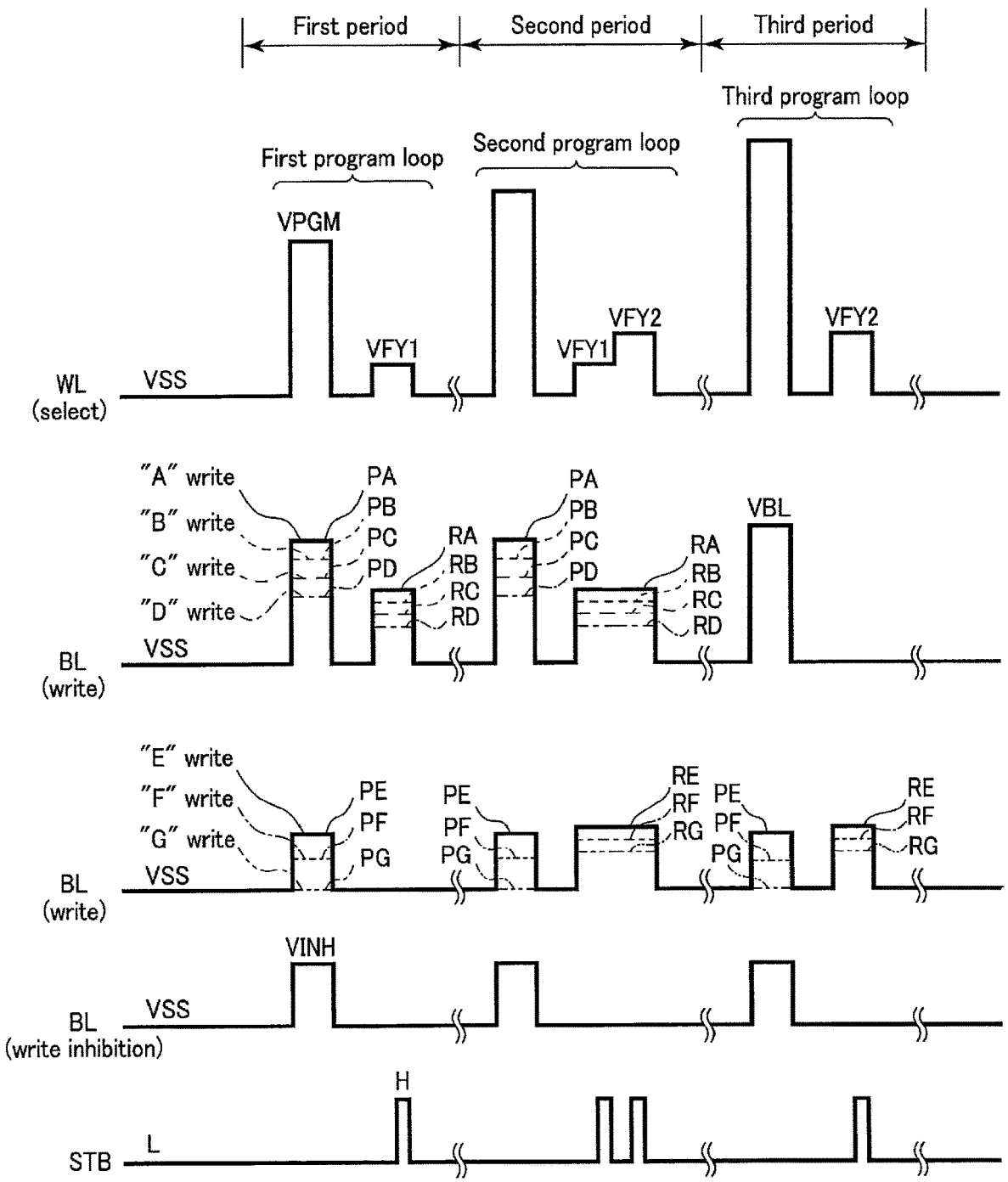
F I G. 14

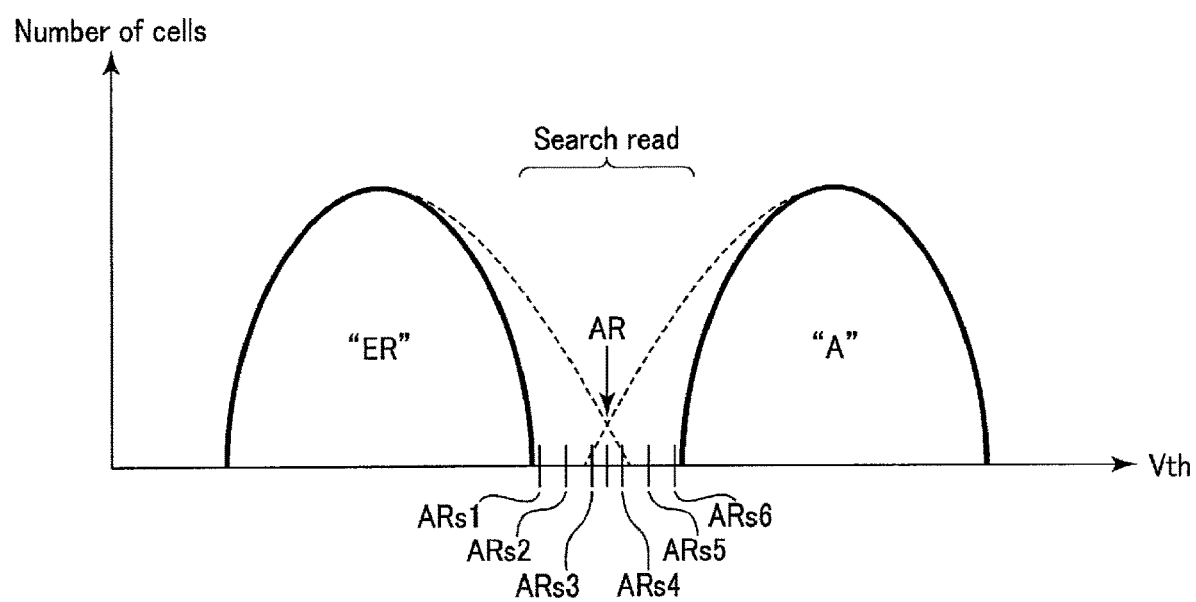
F I G. 15

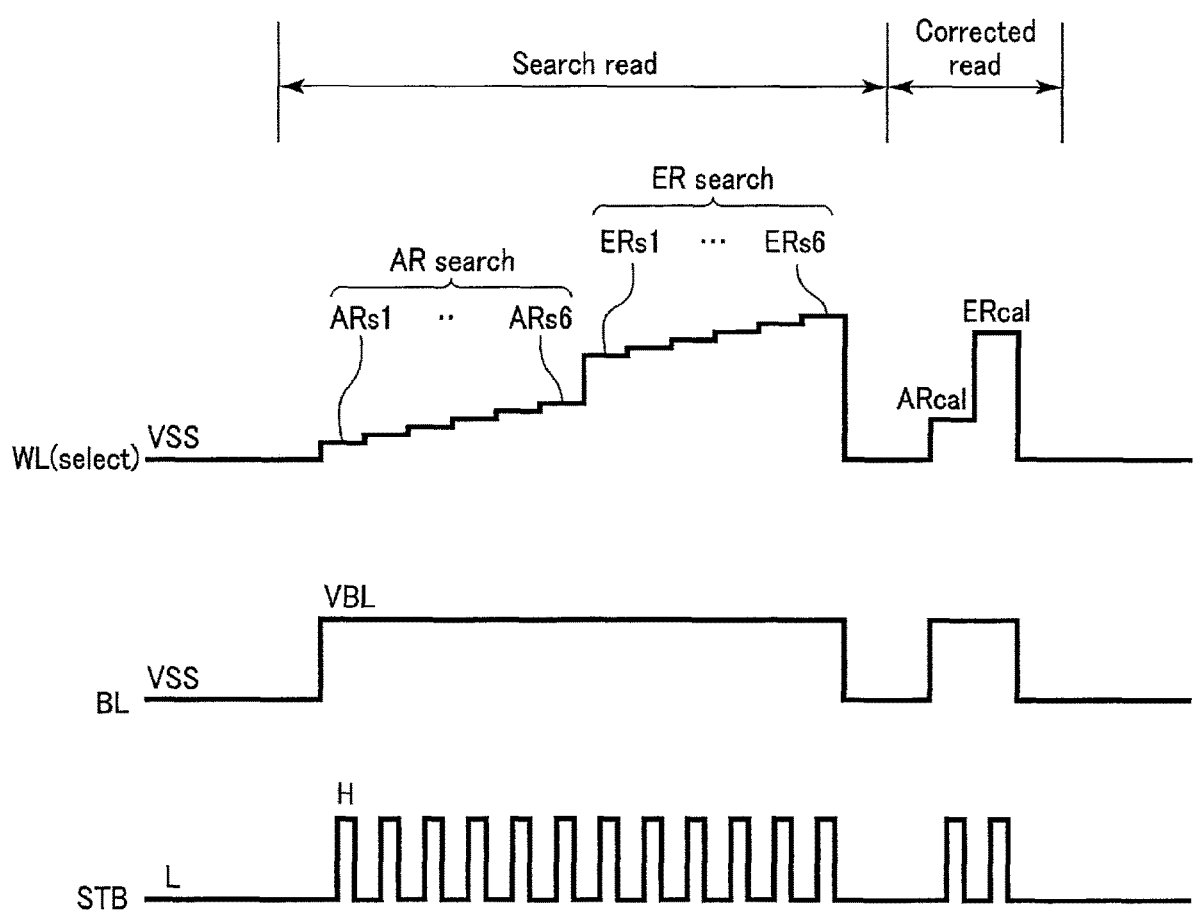
F I G. 16

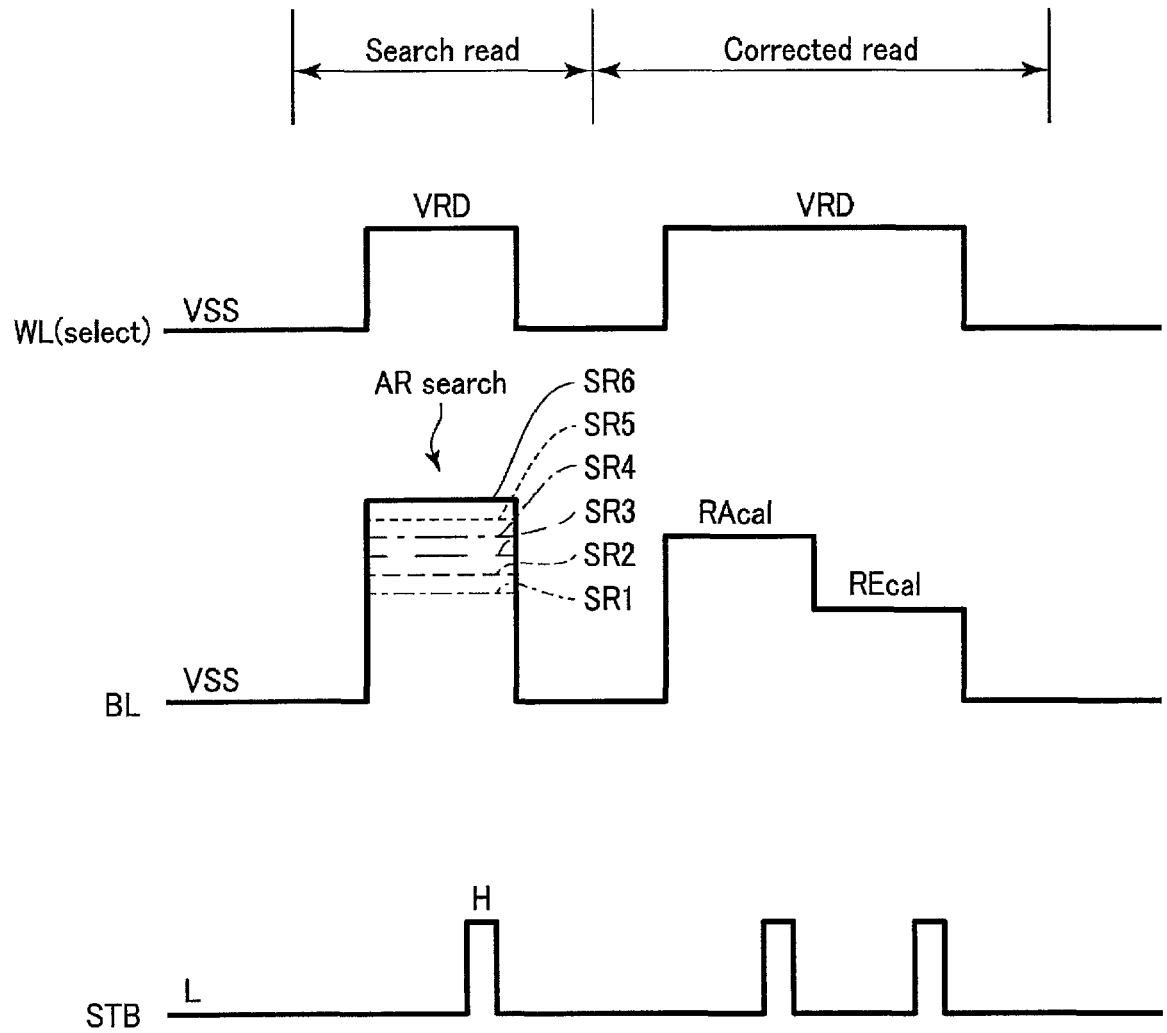
F I G. 20

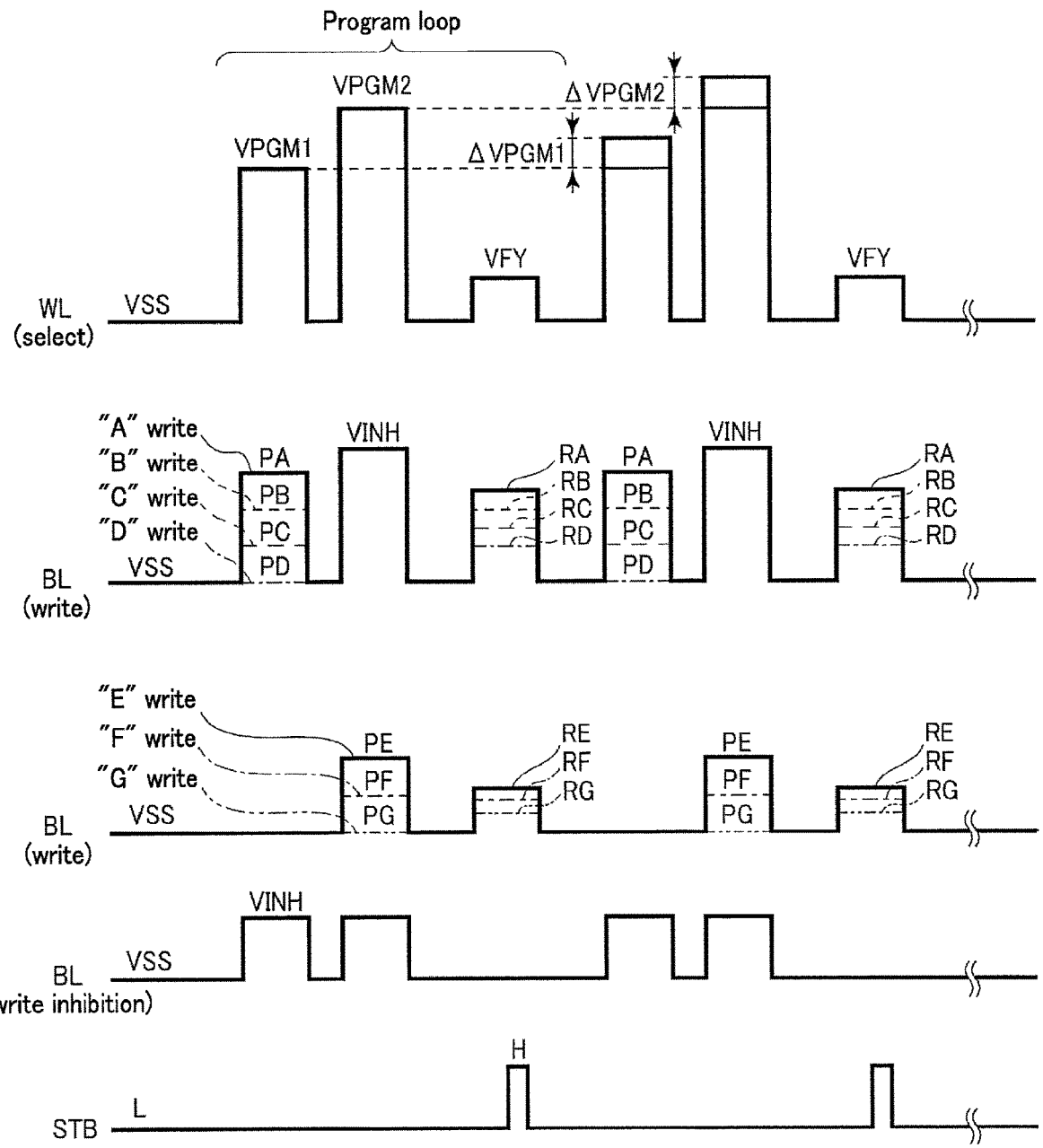
F I G. 21

SEMICONDUCTOR MEMORY DEVICE

CROSS-REFERENCE TO RELATED APPLICATIONS

This application is based upon and claims the benefit of priority from Japanese Patent Application No. 2017-180511, filed Sep. 20, 2017, the entire contents of which are incorporated herein by reference.

FIELD

Embodiments described herein relate generally to a semiconductor memory device.

BACKGROUND

A NAND type flash memory as a semiconductor memory device is known.

BRIEF DESCRIPTION OF THE DRAWINGS

FIG. 1 is a block diagram illustrating an example of a general configuration of a memory system including a semiconductor memory device according to a first embodiment;

FIG. 2 is a diagram illustrating an example of a circuit configuration of a memory cell array in the first embodiment;

FIG. 4 is a diagram illustrating an example of a cross-sectional configuration of the memory cell array in the first embodiment;

FIG. 12 is a diagram illustrating examples of voltages applied to various interconnects during a write operation of a semiconductor memory device according to a fourth embodiment;

FIG. 14 is a diagram illustrating examples of voltages applied to various interconnects during a write operation of a semiconductor memory device according to a fifth embodiment;

FIG. 15 is a diagram of threshold distributions of memory cell transistors MT corresponding respectively to an "ER" level and an "A" level after the write operation;

FIG. 16 is a diagram illustrating examples of voltages applied to various interconnects during a search read operation and a corrected read operation corresponding to read voltages AR and ER;

FIG. 20 is a diagram illustrating examples of voltages applied to various interconnects during a read operation of a semiconductor memory device according to a modification of the eighth embodiment; and FIG. 21 is a diagram illustrating examples of voltages applied to various interconnects during a read operation of a semiconductor memory device according to a modification of the fourth embodiment.

DETAILED DESCRIPTION

Figure 3:
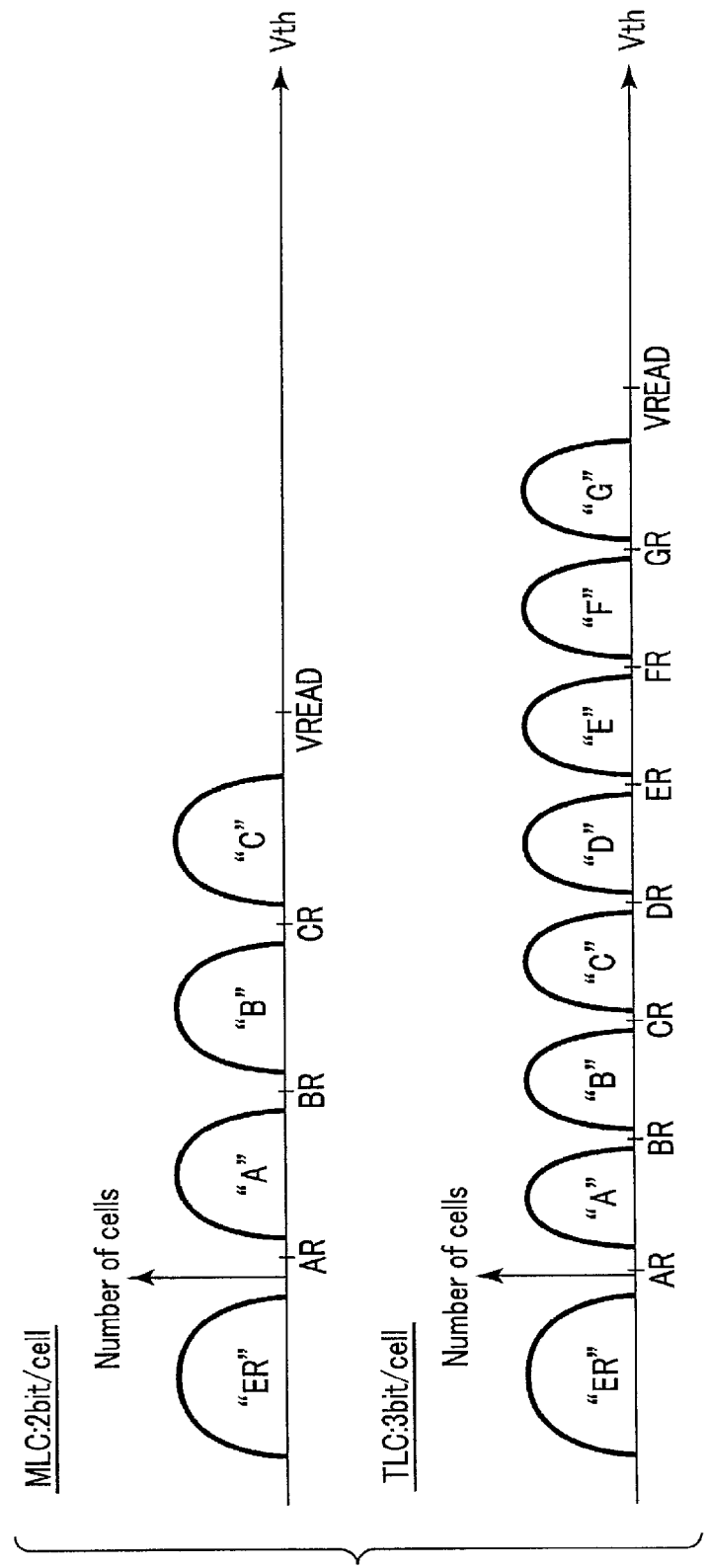
FIG. 3 is a diagram illustrating an example of a threshold distribution of memory cell transistors in the first embodiment.

A semiconductor memory device according to an embodiment includes a plurality of memory cells, a word line, a plurality of bit lines, and a controller. Each of the plurality of memory cells stores a plurality of bits of data based on a threshold voltage. The plurality of memory cells are set to have a first threshold voltage in a case of storing first data as the plurality of bits of data, set to have a second threshold voltage higher than the first threshold voltage in a case of storing second data as the plurality of bits of data, and set to have a third threshold voltage higher than the second threshold voltage in a case of storing third data as the plurality of bits of data. The word line is connected to a plurality of the memory cells. Each of the plurality of bit lines is connected to a plurality of the memory cells. The controller performs a write including a program loop including a program operation. In the program operation, while applying a program voltage to the word line, the controller applies a first voltage to a bit line connected to memory cells to which the first data is to be written, applies a second voltage lower than the first voltage to a bit line connected to memory cells to which the second data is to be written, and applies a third voltage lower than the second voltage to a bit line connected to memory cells to which the third data is to be written.

Hereinafter, embodiments will be described with reference to the drawings. The drawings are schematic. In the following description, the same reference signs denote constituent elements having substantially the same functions and configurations. Numeric characters after the letters constituting a reference sign, letters after the numeric characters constituting a reference sign, and "under bar+letters" attached to the letters constituting a reference sign are referenced by reference signs containing the same letters, and are used to distinguish components having a similar configuration. When the components denoted by the reference signs containing the same letters do not need to be distinguished from each other, the components are referred to by the reference signs containing only the same letters or numeric characters.

1 First Embodiment

A semiconductor memory device according to a first embodiment will be described below.

[1-1] Configuration

[1-1-1] Entire Configuration of the Semiconductor Memory Device 10

FIG. 1 illustrates an example of a general configuration of a semiconductor memory device 10 according to the first embodiment. As illustrated in FIG. 1, the semiconductor memory device 10 comprises a memory cell array 11, a sense simplifier module 12, a row decoder 13, an input/output circuit 14, a register 15, a logic controller 16, a sequencer 17, a ready/busy controller 18, and a voltage generator 19.

The memory cell array 11 includes blocks BLK0 to BLKn (n is a integer equal to one or more). The block BLK is a set of a plurality of nonvolatile memory cells associated with bit lines and word lines, and for example, serves as a data erase unit. Erase operations are not limited to this, and other erase operations are described in U.S. patent application Ser. No. 13/235,389 entitled "Non-volatile Semiconductor Memory Device" filed Sep. 18, 2011 and U.S. patent application Ser. No. 12/694,690 entitled "Non-volatile Semiconductor Memory Device" filed Jan. 27, 2010. These patent applications are hereby incorporated by reference in their entirety.

The sense simplifier module 12 can output data DAT read from the memory cell array 11 to an external controller via the input/output circuit 14. The sense simplifier module 12 can also transfer write data DAT received from the external controller via the input/output circuit 14 to the memory cell array 11.

The row decoder 13 can select a target block BLK on which any of various operations is to be performed, based on a block address held in an address register 15B. The row decoder 13 can then transfer a voltage supplied by the voltage generator 19 to the selected block BLK.

The input/output circuit 14 can transmit and receive, for example, input/output signals I/O each with an 8-bit width (I/O1 to I/O8) to and from the external controller. For example, the input/output circuit 14 transfers the write data DAT included in the input/output signal I/O received from the external controller, to the sense simplifier module 12. The input/output circuit 14 also transmits read data DAT transferred from the sense simplifier module 12 to the external controller as the input/output signal I/O.

The register 15 includes a status register 15A, the address register 15B, and a command register 15C. The status register 15A holds status information STS, and transfers the status information STS to the input/output circuit 14 based on an indication from the sequencer 17. The address register 15B holds address information ADD transferred from the input/output circuit 14. A column address, a block address, and a page address included in the address information ADD are used, for example, by the sense amplifier module 12, the row decoder 13, and the sequencer 17, respectively. The command register 15C holds commands CMD transferred from the input/output circuit 14.

The logic controller 16 can control the input/output circuit 14 and the sequencer 17 based on various control signals received from the external controller. The various control signals include, for example, a chip enable signal /CE, a command latch enable signal CLE, an address latch enable signal ALE, a write enable signal /WE, a read enable signal/RE, and a write protect signal /WP. The signal /CE is a signal for enabling the semiconductor memory device 10. The signal CLE is a signal notifying the input/output circuit 14 that a signal input to the semiconductor memory device 10 is the command CMD. The signal ALE is a signal notifying the input/output circuit 14 that a signal input to the semiconductor memory device 10 is the address information ADD. The signals /WE and /RE are, for example, signals commanding the input/output circuit 14 to receive and output the input/output signals I/O. The signal /WP is a signal setting the semiconductor memory device 10 to a protect state, for example, upon power-on and power-off.

The sequencer 17 can control operations of the semiconductor memory device 10 as a whole based on the address information ADD held in the address register 15B and the commands CMD held in the command register 15C. For example, the sequencer 17 controls the sense simplifier module 12, the row decoder 13, the voltage generator 19, and the like to perform various operations such as the write operation and a read operation.

The ready/busy control circuit 18 can generate a ready/busy signal RBn based on the operating state of the sequencer 17. The signal RBn is a signal notifying the external controller whether the semiconductor memory device 10 is in a ready state where the semiconductor memory device 10 accepts instructions from the external controller or in a busy state where the semiconductor memory device 10 accepts no instructions from the external controller.

The voltage generator 19 can generate desired voltages based on control performed by the sequencer 17, and supply the resultant voltages to the memory cell array 11, the sense simplifier module 12, and the row decoder 13, and the like. For example, the voltage generator 19 applies desired voltages to a signal line corresponding to the word line selected according to a page address and signal lines corresponding to unselected word lines.

[1-1-2] Configuration of the Memory Cell Array 11

(Circuit Configuration of the Memory Cell Array 11)

FIG. 2 illustrates an example of a circuit configuration of the memory cell array 11 and a detailed circuit configuration of one block BLK extracted from the memory cell array 11. As illustrated in FIG. 2, the block BLK includes, for example, four string units SU0 to SU3.

Each of the string units SU includes a plurality of NAND strings NS associated with bit lines BL0 to BLm (m is an integer equal to 1 or more), respectively. Each of the NAND strings NS includes, for example, memory cell transistors MT (MT0 to MT7) and select transistors ST1 and ST2.

Each of the memory cell transistors MT comprises a control gate and a charge storage layer and can store data in a nonvolatile manner. The memory cell transistors MT0 to MT7 included in each NAND string NS are connected together in series between a source of the select transistor ST1 and a drain of the select transistor ST2. Control gates of the memory cell transistors MT0 to MT7 included in the same block BLK are connected commonly to the word line WL0 to WL7, respectively.

In the description below, a "page" refers to a set of 1-bit data stored in a plurality of the memory cell transistors MT connected to the common word line WL in each string unit UA. Therefore, when 2-bit data is stored in one memory cell transistor MT, two pages of data are stored in a set of a plurality of memory cell transistors MT connected to the common word line WL in one string unit SU.

The select transistors ST1 and ST2 are used to select the string unit SU for various operations. Drains of the select transistors ST1 included in the NAND strings NS corresponding to the same column address are connected commonly to the corresponding bit line BL. Gates of the select transistors ST1 included in the string units SU0 to SU3 are connected commonly to select gate lines SGD0 to SGD3, respectively. In the same block BLK, sources of the select transistors ST2 are connected commonly to a source line SL, and gates of the select transistors ST2 are connected commonly to a select gate line SGS.

In the above-described circuit configuration of the memory cell array 11, the word lines WL0 to WL7 are provided for each block BLK. The bit lines BL0 to BLm are shared among a plurality of the blocks BLK. The source lines SL is shared among a plurality of the blocks BLK. The number of the string units SU included in each block BLK and the numbers of the memory cell transistors MT and the select transistors ST1 and ST2 included in each NAND string NS are only illustrative and can be optionally designed. The number of the word lines WL and select gate lines SGD and SGS are changed based on the number of the memory cell transistors MT and the select transistors ST1 and ST2.

(Threshold Distributions of the Memory Cell Transistors)

The semiconductor memory device 10 according to embodiments described below uses, for example, a multi-level cell (MLC) method in which 2-bit data is stored in one memory cell transistor MT or a triple-level cell (TLC) method in which 3-bit data is stored in one memory cell transistor MT, as a write method for the memory cell transistors MT.

FIG. 3 illustrates threshold distributions and read voltages for the memory cell transistors MT to which the MLC method is applied and threshold distributions and read voltages for the memory cell transistors MT to which the TLC method is applied. An axis of ordinate for the threshold distributions illustrated in FIG. 3 corresponds to the number of memory cell transistors MT, and an axis of abscissas for the threshold distributions corresponds to a threshold voltage Vth for the memory cell transistors MT. As illustrated in FIG. 3, a plurality of the memory cell transistors MT form a plurality of threshold distributions based on the number of bits of stored data.

When the MLC method is applied, the plurality of memory cell transistors MT forms four threshold distributions. The four threshold distributions are referred to as an "ER" level, an "A" level, a "B" level, and a "C" level in order of increasing threshold voltage. In the MLC method, different 2-bit data are assigned to the threshold distributions at the "ER" level, the "A" level, the "B" level, and the "C" level, respectively.

When the TLC method is applied, the plurality of memory cell transistors MT forms eight threshold distributions. The eight threshold distributions are referred to as an "ER" level, an "A" level, a "B" level, a "C" level, a "D" level, an "E" level, an "F" level, and a "G" level in order of increasing threshold voltage. In the TLC method, different 3-bit data are assigned to the threshold distributions at the "ER" level, the "A" level, the "B" level, the "C" level, the "D" level, the "E" level, the "F" level, and the "G" level, respectively.

In each of the write methods, the read voltage is set between the adjacent threshold distributions. For example, a read voltage AR is set between the maximum threshold voltage of the "ER" level and the minimum threshold voltage of the "A" level and used for an operation of determining whether the threshold voltage of each memory cell transistor MT is included in the threshold distribution of the "ER" level or in the threshold distribution of the "A" or higher level. When the read voltage AR is applied to the memory cell transistors MT, the memory cell transistors corresponding to the "ER" level are set to an on state, and the memory cell transistors included in the threshold distribution of the "A" or higher level are set to an off state.

The other read voltages are similarly set; a read voltage BR is set between the threshold distribution of the "A" level and the threshold distribution of the "B" level, a read voltage CR is set between the threshold distribution of the "B" level and the threshold distribution of the "C" level, a read voltage DR is set between the threshold distribution of the "C" level and the threshold distribution of the "D" level, a read voltage ER is set between the threshold distribution of the "D" level and the threshold distribution of the "E" level, a read voltage FR is set between the threshold distribution of the "E" level and the threshold distribution of the "F" level, and a read voltage GR is set between the threshold distribution of the "F" level and the threshold distribution of the "G" level.

In each of the write methods, a read pass voltage VREAD is set as a voltage higher than the highest threshold voltage in the highest threshold distribution. The memory cell transistors MT with the read pass voltage VREAD applied to the gate thereof are set to the on state regardless of data stored therein.

Furthermore, in each write method, a verify voltage is set between the adjacent threshold distributions. For example, in the write operation, the semiconductor memory device 10 uses verify voltages AV, BV, CV, DV, EV, FV, and GV for verify operations for the "A" level, the "B" level, the "C" level, the "D" level, the "E" level, the "F" level, and the "G" level, respectively. The verify voltages AV, BV, CV, DV, EV, FV, and GV may be the same as or different from the read voltages AR, BR, CR, DR, ER, FR, and GR.

The number of the bits of the data stored in one memory cell transistor MT and the assignment of the data to the threshold distributions of the memory cell transistors MT described above are only illustrative, and the present invention is not limited to this. For example, data of 4 or more bits may be stored in one memory cell transistor. MT. Furthermore, the read voltage and the read pass voltage may be set to the same voltage value or to different voltage values for each method.

(Structure of the Memory Cell Array 11)

FIG. 4 illustrates an example of a cross-sectional structure of the memory cell array 11 in the first embodiment, and also illustrates a cross section of the memory cell array 11 with interlayer dielectrics omitted therefrom, and an X axis, a Y axis, and a Z axis.

As illustrated in FIG. 4, the semiconductor memory device 10 comprises a P-type well region 20, a plurality of conductors 21 to 26, a plurality of semiconductor pillars MH, and a plurality of contact plugs LI.

The P-type well region 20 is formed in a front surface of a semiconductor substrate. Above the P-type well region 20, for example, four-layer conductors 21, eight-layer conductors 22, and four-layer conductors 23 are stacked in order via interlayer dielectrics. The conductors 21 to 23 are formed, for example, like plates spreading in the X direction and the Y direction. The conductors 21 and 23 function as the select gate lines SGS and SGD, and the conductors 22 functions as the word lines WL. One of the stacked conductors 22 is assigned to one word line WL. The stacked plurality of conductors as illustrated in FIG. 4 or a conductor formed as one layer may be assigned to each of the select gate lines SGS and SGD.

The plurality of semiconductor pillars MH is formed to extend from a top surface of the set of the conductors 23 to a top surface of the P-type well region 20. In other words, the semiconductor pillars MH are provided to extend through the conductors 21 to 26 along the Z direction. For example, each of the semiconductor pillars MH includes a block insulating film 27, an insulating film 28, a tunnel oxide film 29, and a conductive semiconductor material 30.

Specifically, the block insulating film 2733 is provided on an inner wall of a memory hole forming the semiconductor pillar MH. The insulating film 28 is provided on an inner wall of the block insulating film 27. The tunnel oxide film 29 is provided on an inner wall of the insulating film 28. The semiconductor material 30 is embedded inside the tunnel oxide film 29. A different material may be contained in the semiconductor material 30.

Conductors 24 are formed above the conductors 23 and the semiconductor pillars MH. The conductors 24 function as the bit lines BL and are connected to the corresponding semiconductor pillars MH. Contact plugs including a conductive material may be formed between the conductors 24 and the corresponding semiconductor pillars MH.

Conductors 25 and 26 are formed between the set of the conductors 23 and the set of the conductors 24. The conductor 25 functions as the source line SL and is connected via a contact plug LI to an $n^+$ impurity diffusion area 31 formed in the front surface of the well region 20. The conductor 26 functions as a well line CPWELL and is connected via the contact plug LI to a $p^+$ impurity diffusion area 32 formed in the front surface of the well region 20. Each of the contact plugs LI is formed like a plate spreading in the X direction and the Z direction.

In the above-described structure of the memory cell array 11, one semiconductor pillar MH corresponds to one NAND string NS. Specifically, an intersection point between the conductor 21 and the semiconductor pillar MH corresponds to the select transistor ST2. An intersection point between the conductor 22 and the semiconductor pillar MH corresponds to the word line WL. An intersection point between the conductor 23 and the semiconductor pillar MH corresponds to the select transistor ST1. The lowermost conductor 21 and the tunnel oxide film 29 are formed to extend to the vicinity of the $n^+$ impurity diffusion area 31, and thus, when the select transistor ST2 is set to the on state, a current path is formed between the NAND string NS and the $n^+$ impurity diffusion area 31.

Furthermore, a plurality of the memory cell arrays 11 structured as described above is arranged in the X direction. For example, one string unit SU comprises a plurality of the NAND strings NS arranged in the X direction. When a plurality of the string units SU is provided in the same block BLK, the conductors 23 corresponding to the select gate line SGD are separated from one another in such a manner as to belong to the respective string units SU.

The configuration of the memory cell array 11 may be different from the above-described one. Other configurations of the memory cell array 11 are described in, for example, U.S. patent application Ser. No. 12/407,403 entitled "Three-dimensional Stacked Non-volatile Semiconductor Memory" filed Mar. 19, 2009, U.S. patent application Ser. No. 12/406,524 entitled Three-dimensional Stacked Non-volatile Semiconductor Memory" filed March 18, U.S. patent application Ser. No. 12/679,991 entitled "Non-volatile Semiconductor Memory Device and Manufacturing Method for the Same" filed Mar. 25, 2010, and U.S. patent application Ser. No. 12/532,030 entitled "Semiconductor Memory and Manufacturing Method for the Same" filed Mar. 23, 2009. These patent applications are hereby incorporated by reference in their entirety.

[1-1-3] Configuration of the Sense Amplifier Module 12

Figure 5:
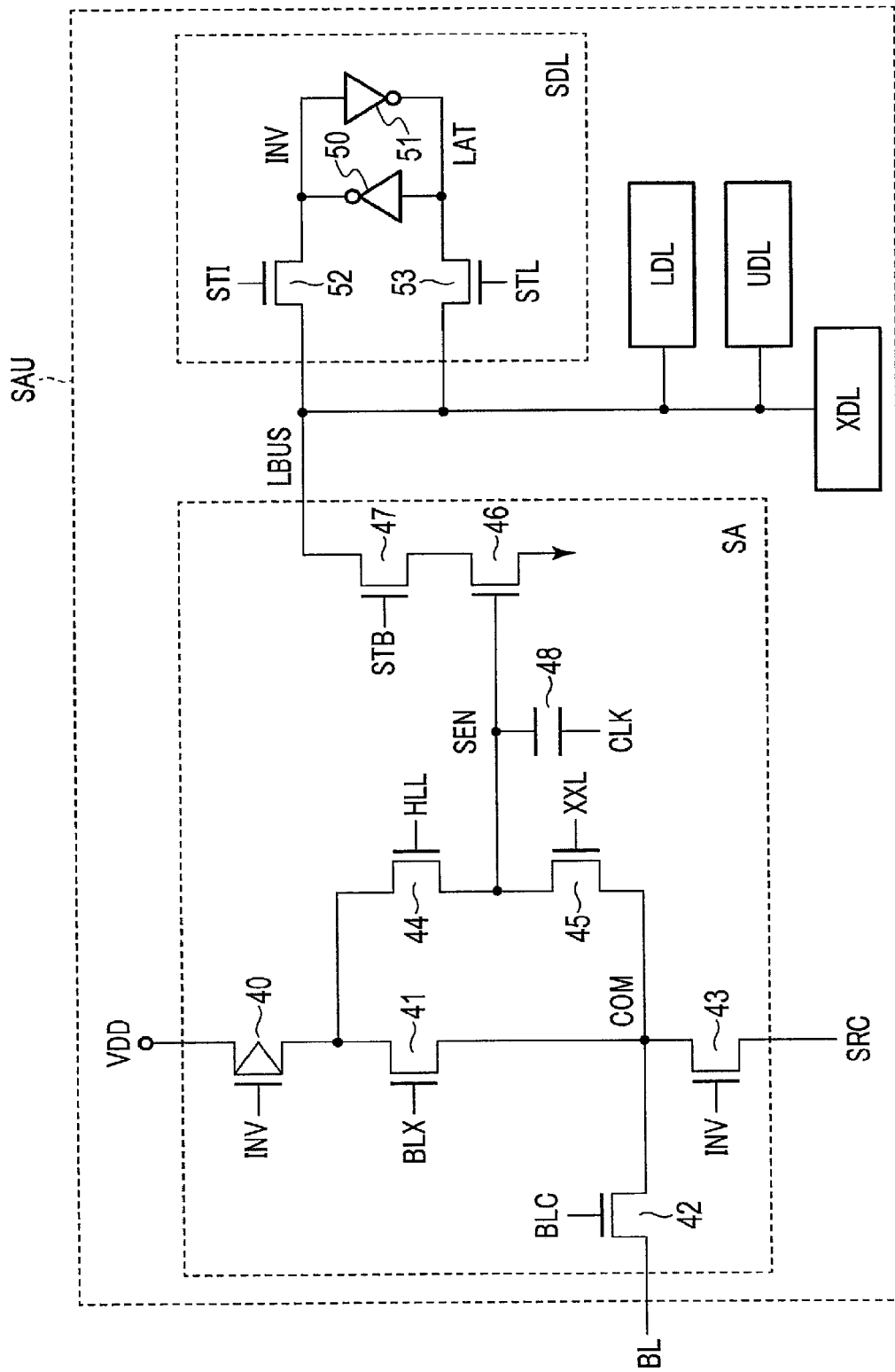
FIG. 5 is a diagram of an example of a circuit configuration of a sense amplifier module in the first embodiment.

FIG. 5 illustrates an example of a circuit configuration of the sense amplifier module 12 in the first embodiment. The sense amplifier module 12 includes a plurality of sense amplifier units SAU associated with the respective bit lines BL0 to BLm. FIG. 5 illustrates a detailed circuit configuration of one sense amplifier unit SAU extracted from the sense amplifier module 12.

As illustrated in FIG. 5, the sense amplifier unit SAU includes a sense simplifier unit SA and latch circuits SDL, LDL, UDL, and XDL. The sense simplifier SA and the latch circuits SDL, LDL, UDL, and XDL are connected together by a bus LBUS to allow data to be transmitted and received among these components.

For example, during the read operation, the sense simplifier unit SA senses data read from the corresponding bit line BL to determine whether the read data is "0" or "1". The sense amplifier unit SA includes, for example, a p-channel MOS transistor 40, an n-channel MOS transistor 41 to 47, and a capacitor 48.

The transistor 40 comprises a first end connected to a power supply terminal and a gate connected a node INV. The transistor 41 comprises a first end connected to a second end of the transistor 40, a second end connected to a node COM, and a gate to which a control signal BLX is input. The transistor 42 comprises a first end connected to the node COM, a second end connected to the corresponding bit line BL, and a gate to which a control signal BLC is input. The transistor 43 comprises a first end connected to the node COM, a second end connected to a node SRC, and a gate connected to the node INV. The transistor 44 comprises a first end connected to a second end of the transistor 40, a second end connected to a node SEN, and a gate to which a control signal HLL is input. The transistor 45 comprises a first end connected to the node SEN, a second end connected the node COM, and a gate to which a control signal XXL is input. The transistor 46 comprises a first end connected that is grounded and a gate connected to the node SEN. The transistor 47 comprises a first end to which a second end of the transistor 46 is connected, a second end connected to the bus LBUS, and a gate to which a control signal STB is input. The capacitor 48 comprises a first end connected to the node SEN and a second end to which a clock CLK is input.

The above-described control signals BLX, HLL, XXL, and STB are generated, for example, by the sequencer 17. For example, a voltage VDD serving as a power-supply voltage for the semiconductor memory device 10 is applied to a power supply line connected to the first end of the transistor 40. For example, a voltage VSS serving as a ground voltage for the semiconductor memory device 10 is applied to the node SRC.

The latch circuits SDL, LDL, and UDL can temporarily hold the read data. The latch circuit XDL is connected to the input/output circuit 14 and used for input and output of data between the sense amplifier unit SAU and the input/output circuit 14. The latch circuit SDL includes, for example, inverters 50 and 51 and n-channel MOS transistors 52 and 53.

The inverter 50 comprises an input node connected to a node LAT and an output node connected to the node INV. The inverter 51 comprises an input node connected to the node INV and an output node connected to the node LAT.

The transistor 52 comprises a first end connected to the node INV, a second end connected to the bus LBUS, and a gate to which a control signal STI is input. The transistor 53 comprises a first end connected to the node LAT, a second end connected to the bus LBUS, and a gate to which a control signal STL is input. A circuit configuration of each of the latch circuits LDL, UDL, and XDL is similar to, for example, the circuit configuration of the latch circuit SDL, and thus, description thereof is omitted.

In the above-described sense amplifier module 12, a timing when each sense amplifier unit SAU identifies the data read and retrieved onto the bit line BL is based on a timing when the control signal STB is asserted.

The phrase "the sequencer 17 asserts the control signal STB" as used herein corresponds to the sequencer 17 changing the control signal STB from an "L" level to an "H" level. The transistor with a voltage of the "H" level input to the gate thereof is assumed to be set to the on state, and the transistor with a voltage of the "L" level input to the gate thereof is assumed to be set to the off state.

The configuration of the sense amplifier module 12 in the first embodiment is not limited to this. For example, in the sense amplifier unit SAU, the transistor 47 with the control signal STB input to the gate thereof may comprise a p-channel MOS transistor. In this case, the phrase "the sequencer 17 asserts the control signal STB" corresponds to the sequencer 17 changing the control signal STB from the "H" level to the "L" level.

For example, any number of the latch circuits may be designed to be provided in the sense amplifier unit SAU. In this case, the number of the latch circuits is designed based, for example, on the number of the bits of the data held in one memory cell transistor MT. Furthermore, a plurality of the bit lines BL may be connected to one sense amplifier unit SAU via a selector.

[1-2] Operation

In the write operation, the semiconductor memory device 10 according to the first embodiment repeatedly executes a program loop that is a combination of a program operation and a verify operation.

The program operation is an operation of applying a program voltage to the selected word line WL to increase the threshold voltage of write target memory cell transistors MT. In the program operation, for write inhibited memory cell transistors MT, an increase in the threshold voltage is suppressed using, for example, a self-boost technique.

The verify operation is a read operation of determining whether the threshold voltage of each memory cell transistor MT reached to the desired threshold voltage. In each program loop, for example, no read is performed during the verify operation on the memory cell transistors MT for which the threshold voltage reached to a desired voltage or which have passed the verification.

Figure 6:
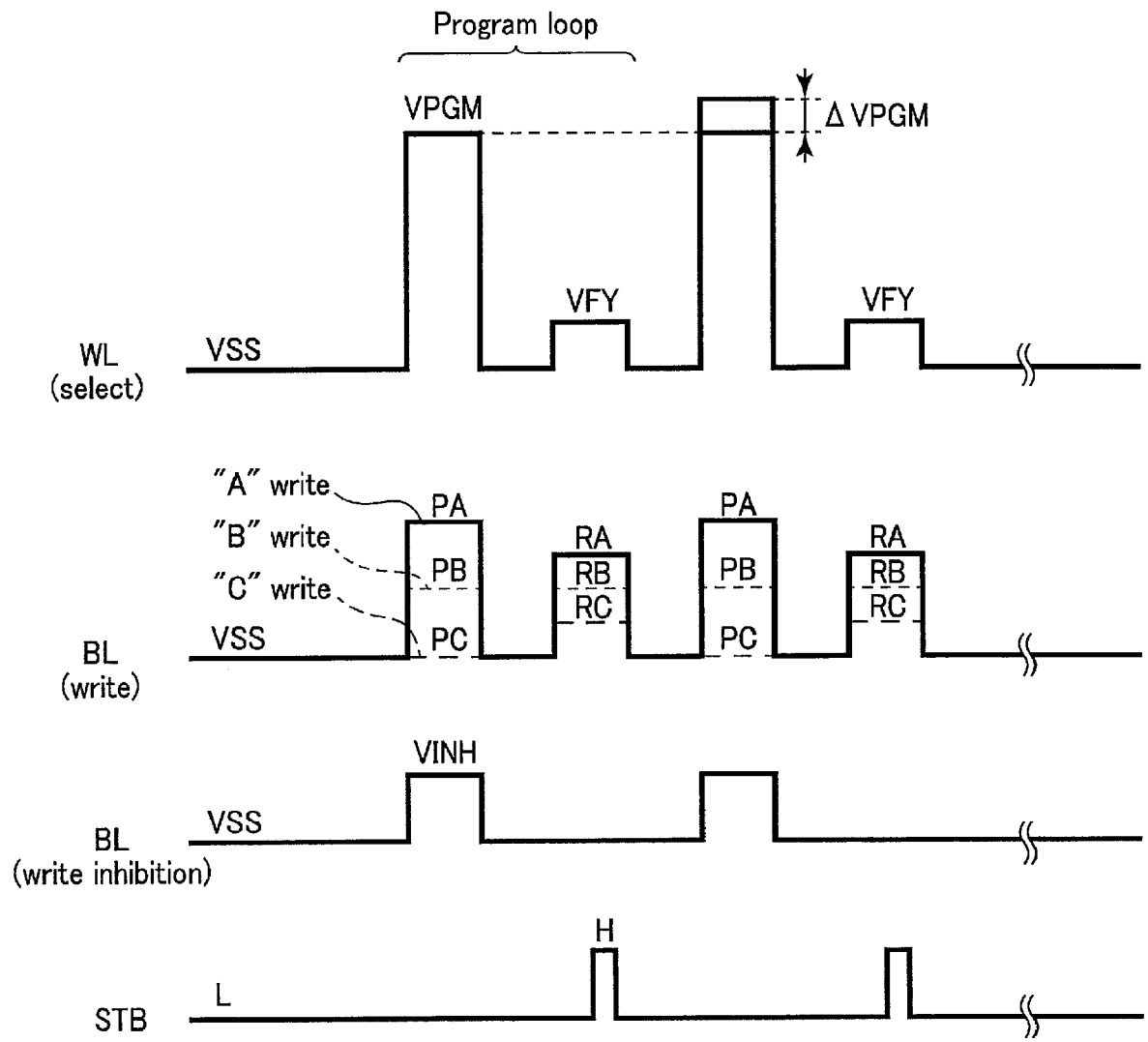
FIG. 6 is a diagram illustrating examples of voltages applied to various interconnects during a write operation of a semiconductor memory device according to the first embodiment.

FIG. 6 illustrates examples of voltages applied to the word line WL and the bit lines BL and a variation in the control signal STB during the write operation of the semiconductor memory device 10 according to the first embodiment.

In the description below, write target bit lines BL refer to bit lines BL connected to write target memory cell transistors MT. Write inhibited bit lines BL refer to bit lines BL connected to write inhibited memory cell transistors MT.

Furthermore, "A" write memory cell transistors MT refer to those of the write target memory cell transistors MT to which data corresponding to the "A" level is to be written to increase the threshold voltage to the "A" level. An "A" write bit line BL refers to a bit line BL included in the write target bit lines BL and which is connected to the "A" write memory cell transistors MT.

Similarly, "B" write and "C" write memory cell transistors MT refer to those of the write target memory cell transistors MT to which data corresponding to the "B" level and the "C" level, respectively, are to be written to increase the threshold voltages to the "B" level and the "C" level, respectively. "B" write and "C" write bit lines BL refer to bit lines BL connected to the "B" write and "C" write memory cell transistors MT, respectively.

In the description below, "A" verify refers to an operation included in the verify operation to determine whether the threshold voltage of each memory cell transistor MT has increased above the "A" level. Likewise, "B" verify and "C" verify refer to operations included in the verify operation to determine whether the threshold voltages of the memory cell transistors MT corresponding to the "B" verify and the "C" verify have increased above the "B" level and the "C" level, respectively.

In an initial state preceding execution of the write operation, the word line WL and the bit lines BL are at the ground voltage VSS, and the control signal STB is at the "L" level as illustrated in FIG. 6.

When the write operation is started, first, the sequencer 17 performs the program operation. In the program operation, the sense amplifier module 12 applies a voltage PA to the "A" write bit lines BL, applies a voltage PB to the "B" write bit lines BL, applies a voltage PC to the "C" write bit lines BL, and applies a voltage VINH to the write inhibited bit lines. The relationship among these voltage values is PC<PB<PA<VINH. When the voltage VINH is applied to the write inhibited bit lines BL, the channel of the corresponding NAND string NS is set to a floating state.

Then, the row decoder 13 applies a voltage VPGM to the selected word line WL. The program voltage VPGM is a high voltage which enables an increase in the threshold voltage of each memory cell transistor MT. When the program voltage VPGM is applied to the selected word line WL, electrons are injected into a charge storage layer of each write target memory cell transistor MT to increase the threshold voltage of each memory cell transistor MT due to a difference in voltage between the selected word line WL and the channel of the NAND string NS corresponding to the write target bit line BL.

At this time, the difference in voltage between the selected word line WL and the channel of the NAND string NS corresponding to the write target bit line BL varies according to the written level. A lower voltage of the bit line BL results in an increased difference between the voltage of the bit line BL and the program voltage VPGM, and thus, the amount of increase in the threshold voltage of each memory cell transistor MT with the program voltage VPGM applied thereto increases in order of "A" write<"B" write<"C" write.

On the other hand, the voltage of the channel of the NAND string NS in the floating state is increased by coupling with the word line WL, leading to a decrease in the difference in voltage between the selected word line WL and the channel of the NAND string NS corresponding to the write inhibited bit line BL. This suppresses a variation in the threshold voltage of the write inhibited memory cell transistor MT (self-boost technique).

Then, the row decoder 13 reduces the voltage of the selected word line WL to VSS, and the sense amplifier module 12 reduces the voltage of each bit line BL to VSS. The sequencer 17 then shifts from the program operation to the verify operation.

In the verify operation, the sense amplifier module 12 applies a voltage RA to the "A" write bit lines BL, applies a voltage RB to the "B" write bit lines BL, and applies a voltage RC to the "C" write bit lines BL. The relationship between these voltage values is RC<RB<RA. The row decoder 13 applies, for example, a verify voltage VFY to the selected word line WL.

As described above, the difference in voltage between the selected word line WL and the channel of the NAND string NS corresponding to the write target bit line BL varies according to the target level of the verify operation.

Specifically, the difference between the voltage RA and the verify voltage VFY is set to correspond to the difference between a voltage VBL and the verify voltage VFY. The difference between the voltage RB and the verify voltage VFY is set to correspond to the difference between the voltage VBL and a verify voltage BV. The difference between the voltage RC and the verify voltage VFY is set to correspond to the difference between the voltage VBL and a verify voltage CV. The voltage VBL corresponds to a voltage applied to the bit lines BL while a voltage is being applied to the selected word line WL during a typical read operation.

Then, the sequencer 17 asserts the control signal STB during application of the verify voltage VFY. When the control signal STB is asserted, the sense amplifier module 12 executes the "A" verify, the "B" verify, and the "C" verify at a time.

The above-described program operation and verify operation correspond to one program loop. Then, the sequencer 17 steps up the program voltage VPGM and repeatedly executes similar program loops. An amount by which the program voltage VPGM is stepped up may be set to any value. The sequencer 17 ends the write operation upon sensing that, in the program loop, for example, the number of memory cell transistors MT having passed the verify operation has increased above a prescribed number.

As described above, the write operation of the semiconductor memory device 10 according to the first embodiment performs application of different voltages to the corresponding bit lines BL according to the data to be written, starting in the program operation in the first program loop. Furthermore, in the write operation of the semiconductor memory device 10 according to the first embodiment, verify reads at a plurality of levels are executed at a time during each verify operation.

[1-3] Effects of the First Embodiment

The semiconductor memory device 10 according to the above-described first embodiment allows a faster write operation to be achieved. Effects of the semiconductor memory device 10 according to the first embodiment will be described below in detail using a comparative example illustrated in FIG. 7.

Figure 7:
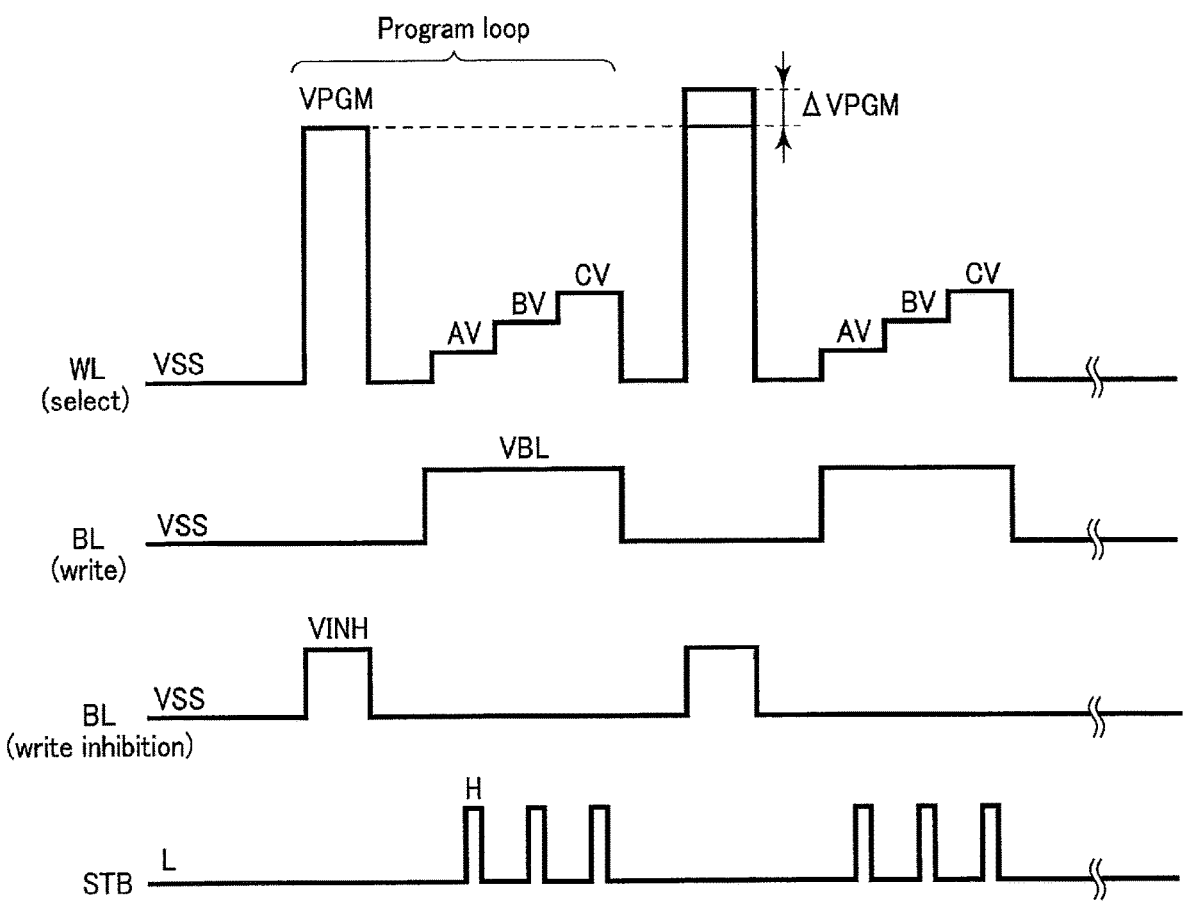
FIG. 7 is a diagram illustrating examples of voltages applied to various interconnects during a write operation of a semiconductor memory device according to a comparative example of the first embodiment.

FIG. 7 illustrates voltages applied to the word line WL and the bit lines BL, respectively, and a variation in the control signal STB, in a write operation of a semiconductor memory device according to the comparative example of the first embodiment. As illustrated in FIG. 7, the write operation in the comparative example is different from the write operation in the first embodiment described using the FIG. 6 in the details of the program operation and the verify operation.

In the program operation in the comparative example, while the program voltage VPGM is being applied to the selected word line WL, the voltages of the write target bit lines BL are maintained at the ground voltage VSS. In other words, in the program operation in the comparative example, the amount of increase in the threshold voltage resulting from one program operation is substantially the same for the "A" write memory cell transistors MT, "B" write memory cell transistors MT, and "C" write memory cell transistors MT.

In this case, the verify operation is passed in order of increasing value of the target threshold voltage, and thus, a timing when the verify operation is passed is the earliest for the "A" write memory cell transistors MT, the second earliest for the "B" write memory cell transistors MT, and the latest for the "C" write memory cell transistors MT.

In other words, for memory cell transistors MT with a smaller target threshold voltage value, after the memory cell transistor MT passes the verify operation, the program voltage VPGM is applied to the memory cell transistor MT which has been set to the write inhibition state. When the program voltage VPGM is applied to the memory cell transistor MT having passed the verify operation, program disturb may occur to extend the threshold distribution.

In contrast, the semiconductor memory device 10 according to the first embodiment varies the voltages applied to the bit lines BL according to the target threshold voltage to adjust the amount of increase in the threshold voltage of each memory cell transistor MT during one program operation.

Specifically, the semiconductor memory device 10 according to the first embodiment adjusts the voltages applied to the bit lines BL in such a manner that the amount of increase in the threshold voltage during the first program operation increases in order of the "A" write, the "B" write, and the "C" write.

As a result, the semiconductor memory device 10 according to the first embodiment enables, in the iteration of the program loops, synchronization between a timing when the "A" write memory cell transistors MT pass the "A" verify and a timing when the "B" write memory cell transistors MT passes the "B" verify and a timing when the "C" write memory cell transistors MT passes the "C" verify.

Consequently, the semiconductor memory device 10 according to the first embodiment can suppress the adverse effect of the program disturb and can thus restrain extension of the threshold distributions. Therefore, the semiconductor memory device according to the first embodiment can reduce the number of error bits in the read operation, allowing reliability of written data to be improved.

Furthermore, the program operation in the comparative example uses the program voltage VPGM optimized for the "A" write, which involves the lowest written threshold voltage, thus increasing the time needed for the "B" write and the "C" write, which involve higher written threshold voltages. In contrast, in the semiconductor memory device 10 according to the first embodiment, by using the program voltage VPGM optimized for the "C" write which involves the highest written threshold voltage and by adjusting the voltage of the bit line BL as necessary, effective write voltages corresponding to respective "A" write, "B" write and "C" write, can be set.

Therefore, the semiconductor memory device 10 according to the first embodiment can reduce the period of time until each of the "B" write and the "C" write, corresponding to higher levels, ends. Therefore, the semiconductor memory device 10 according to the first embodiment allows a faster write operation to be achieved than the semiconductor memory device 10 according to the comparative example.

Furthermore, in the verify operation in the comparative example, the voltage VBL is applied to the write target bit lines BL, and the verify voltages AV, BV, and CV are applied to the selected word line WL in this order. While each of the verify voltages AV, BV, and CV is being applied to the selected word line WL, the control signal STB is asserted. In other words, in the verify operation in the comparative example, the "A" verify, the "B" verify, and the "C" verify are executed at different timings.

In contrast, the semiconductor memory device 10 according to the first embodiment uses one type of verify voltage VFY during the verify operation to adjust the voltages applied to the bit lines BL according to the value of the threshold voltage for determination.

Specifically, the semiconductor memory device 10 according to the first embodiment varies the voltage of each bit line BL as needed while the verify voltage VFY is being applied to the selected word line WL, to form, in the "A" write memory cell transistors MT, the same state as that of the "A" verify in the comparative example and to form, in the "B" write memory cell transistors MT, the same state as that of the "B" verify in the comparative example and to form, in the "C" write memory cell transistors MT, the same state as that of the "C" verify in the comparative example.

As a result, the semiconductor memory device 10 according to the first embodiment can perform verify operations corresponding to a plurality of levels at a time by asserting the control signal STB once. Therefore, the write operation of the semiconductor memory device 10 according to the first embodiment enables a reduction in the duration of the verify operation and can thus be performed faster than the write operation of the semiconductor memory device 10 according to the comparative example.

2 Second Embodiment

A semiconductor memory device 10 according to a second embodiment is configured similarly to the semiconductor memory device 10 according to the first embodiment. The semiconductor memory device 10 according to the second embodiment performs a write operation similar to that in the first embodiment while applying a quick pass write (QPW) method to the write operation.

[2-1] Operation

[2-1-1] QPW Method

Figure 8:
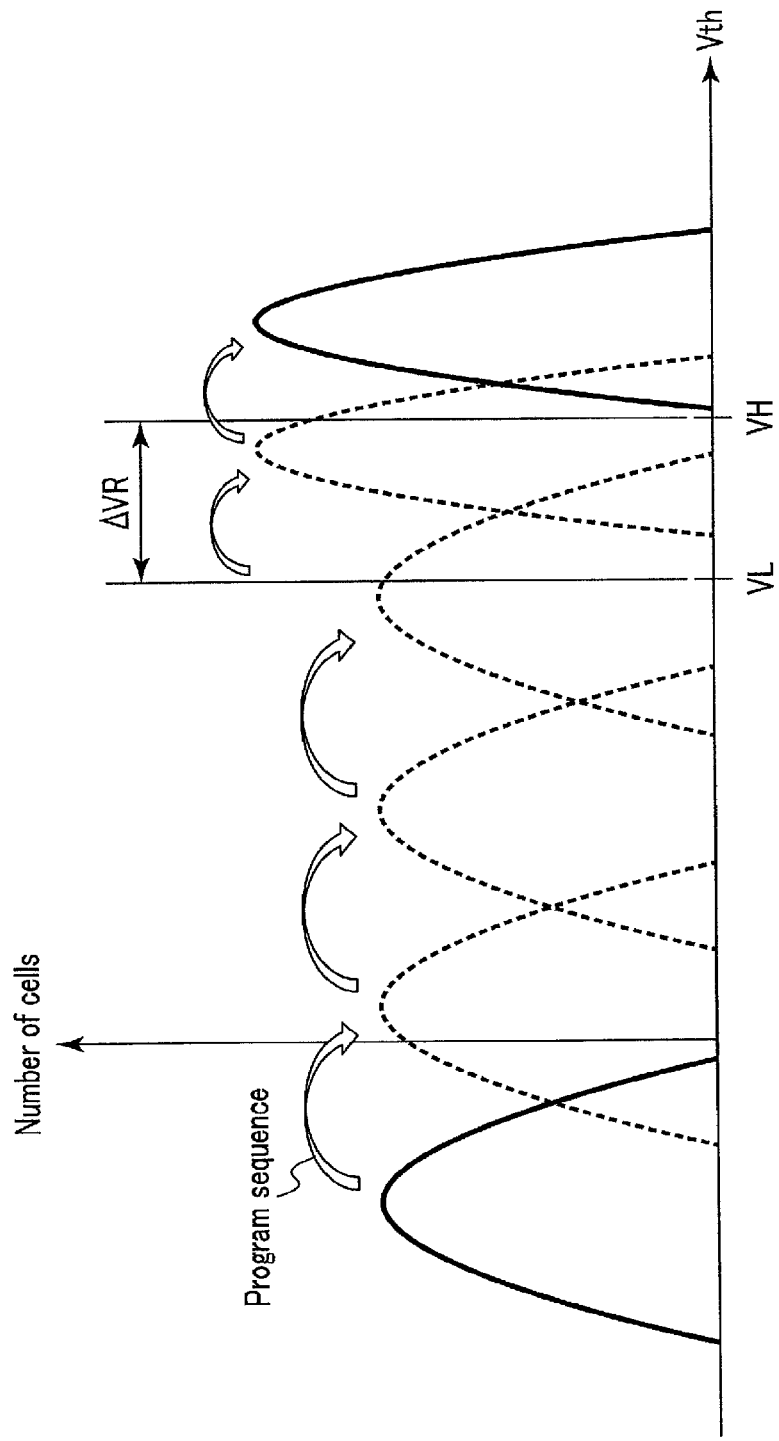
FIG. 8 is a diagram illustrating a write operation to which a Quick Pass Write method is applied.

FIG. 8 illustrates that, when the write operation to which the QPW method is applied is performed, the threshold distribution of the memory cell transistors MT is shifted with progression of the write operation.

As illustrated in FIG. 8, in the QPW-based write operation, two types of verify voltages VH and VL are set for a write operation for one level. The verify voltage VL is set lower than the verify voltage VH by any value ΔVR. The verify voltage VH corresponds to the final target threshold voltage of each memory cell transistor MT and, for example, to the verify voltage AV, described using FIG. 3. The memory cell transistors MT having passed verify with the verify voltage VH are set to the write inhibition state for the subsequent write operation. The verify voltages VH and VL are used for the verify operation in each program loop.

In the program operation in each program loop, prescribed voltages are applied to the write target bit lines BL based on verify results obtained using the verify voltages VH and VL. Specifically, the sense amplifier module 12 applies, for example, the ground voltage VSS to the corresponding bit lines BL when the threshold voltage of each memory cell transistor MT is lower than the voltage VL, and applies, for example, a voltage higher than the ground voltage VSS and lower than the voltage VINH to the corresponding bit lines BL when the threshold voltage of each memory cell transistor MT is equal to or higher than the voltage VL.

In this state, when the program voltage VPGM is applied to the word line selected by the row decoder 13, the amount of increase in the threshold voltage of each memory cell transistors MT with a threshold voltage which is equal to or higher than the voltage VL and lower than the voltage VH is smaller than the amount of increase in the threshold voltage of the each memory cell transistor MT with a threshold voltage which is lower than the voltage VL as illustrated in FIG. 8.

Thus, the write operation with the QPW method applied thereto restrains the final target threshold voltage VH of each memory cell transistor MT from being substantially exceeded, resulting in a narrow threshold distribution of the memory cell transistors MT with the write operation thereon completed.

The above-described verify voltages VH and VL are provided for each written level when one memory cell transistors MT stores a plurality of bits of data. Specifically, when the MLC method is applied, for example, verify voltages AVL and AVH are set in association with the "A" level, verify voltages BVL and BVH are set in association with the "B" level, and verify voltages CVL and CVH are set in association with the "C" level. Each of the verify voltages AVL, BVL, and CVL corresponds to the lower verify voltage VL, and each of the verify voltages AVH, BVH, and CVH corresponds to the higher verify voltage VH.

Details of the QPW method are described in U.S. patent application Ser. No. 14/263,948 entitled "Non-volatile Semiconductor Memory Device" filed Apr. 28, 2014 and U.S. patent application Ser. No. 12/563,296 entitled "Non-volatile Semiconductor Memory Device" filed Sep. 21, 2009.

[2-1-2] Write Operation

Figure 9:
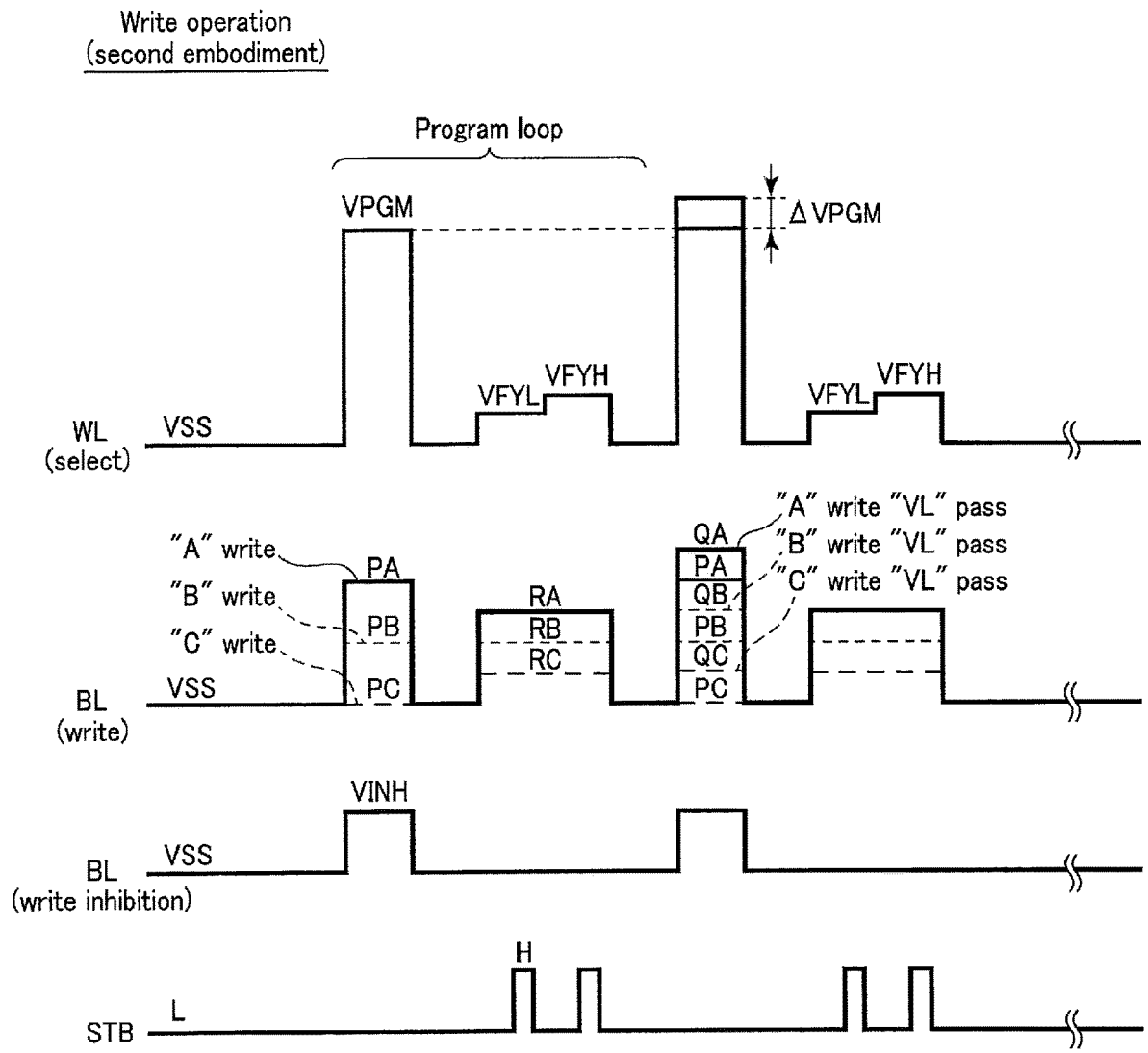
FIG. 9 is a diagram illustrating examples of voltages applied to various interconnects during a write operation of a semiconductor memory device according to a second embodiment.

FIG. 9 illustrates examples of voltages applied to the word line WL and the bit lines BL, respectively, and a variation in the control signal STB, in a write operation of the semiconductor memory device 10 according to the second embodiment.

In the description below, "VL" verify refers to an operation included in the verify operation and in which the sense amplifier module 12 determines whether the threshold voltage of each memory cell transistor MT has increased above a voltage corresponding to the verify voltage VL. "VH" verify refers to an operation included in the verify operation and in which the sense amplifier module 12 determines whether the threshold voltage of each memory cell transistor MT has increased above a voltage corresponding to the verify voltage VH.

As illustrated in FIG. 9, when the write operation is started, first, the sequencer 17 performs the program operation. This program operation is similar to the program operation described in the first embodiment using FIG. 6, and thus, description thereof is omitted.

When the program operation ends, the sequencer 17 then performs the verify operation. In the verify operation, the sense amplifier module 12 applies the voltage RA to the "A" write bit lines BL, applies the voltage RB to the "B" write bit lines BL, and applies the voltage RC to the "C" write bit lines BL.

Then, the row decoder 13 applies, for example, a verify voltage VFYL and a verify voltage VFYH consecutively to the selected word line WL. The verify voltage VFYH is a voltage higher than the verify voltage VFYL. The verify voltages VFYH and VFYL correspond to the verify voltages VH and VL for the QPW method, described using FIG. 8.

As described above, a possible difference in voltage between the selected word line WL and the channel of the NAND string NS corresponding to the write target bit line BL varies according to the target level of the verify operation.

Specifically, the difference between the voltage RA and the verify voltage VFYL is set to correspond to the difference between the voltage VBL and the verify voltage AVL. The difference between the voltage RA and the verify voltage VFYH is set to correspond to the difference between the voltage VBL and the verify voltage AVH. The difference between the voltage RB and the verify voltage VFYL is set to correspond to the difference between the voltage VBL and the verify voltage BVL. The difference between the voltage RB and the verify voltage VFYH is set to correspond to the difference between the voltage VBL and the verify voltage BVH. The difference between the voltage RC and the verify voltage VFYL is set to correspond to the difference between the voltage VBL and the verify voltage CVL. The difference between the voltage RC and the verify voltage VFYH is set to correspond to the difference between the voltage VBL and the verify voltage CVH.

Then, the sequencer 17 asserts the control signal STB while each of the verify voltages VFYL and VFYH is being applied.

When the control signal STB is asserted while the verify voltage VFYL is being applied to the selected word line WL, the sense amplifier module 12 performs "VL" verify operations corresponding to the "A" level, the "B" level, and the "C" level, respectively, at a time.

When the control signal STB is asserted while the verify voltage VFYH is being applied to the selected word line WL, the sense amplifier module 12 performs "VL" verify operations corresponding to the "A" level, the "B" level, and the "C" level, respectively, at a time.

The above-described program operation and verify operation correspond to the first program loop, and the sequencer 17 executes the second program loop. In the next program loop, the sequencer 17 performs program operations based on the respective results of the "VL" verify and the "VH" verify.

Specifically, the sense amplifier module 12 applies the voltage PA to the bit lines BL corresponding to those of the "A" write memory cell transistors MT which have not passed the "VL" verify and the "VH" verify, and applies the voltage QA to the bit lines BL corresponding to those of the "A" write memory cell transistors MT which have passed the "VL" verify and have not passed the "VH" verify.

The sense amplifier module 12 applies the voltage PB to the bit lines BL corresponding to those of the "B" write memory cell transistors MT which have not passed the "VL" verify and the "VH" verify, and applies the voltage QB to the bit lines BL corresponding to those of the "B" write memory cell transistors MT which have passed the "VL" verify and have not passed the "VH" verify.

The sense amplifier module 12 applies the voltage PC to the bit lines BL corresponding to those of the "C" write memory cell transistors MT which have not passed the "VL" verify or the "VH" verify, and applies the voltage QC to the bit lines BL corresponding to those of the "C" write memory cell transistors MT which have passed the "VL" verify and have not passed the "VH" verify.

The sense amplifier module 12 applies the voltage VINH to the bit lines BL corresponding to those memory cell transistors MT of each of the sets of the "A" write, "B" write, and "C" write memory cell transistors MT which have passed "VH" verify, and also applies the voltage VINH to the write inhibited bit lines BL.

The relationship among the above-described voltage values is, for example, PC<QC<PB<QB<PA<QA<VINH. The present invention is not limited to this, and the relationship may be at least PC<PB<PA and PC<QC<VINH and PB<QB<VINH and PA<QA<VINH.

Then, the row decoder 13 applies the program voltage VPGM to the selected word line WL. When the program voltage VPGM is applied to the selected word line WL, electrons are injected into the charge storage layer of each write target memory cell transistor MT due to a difference in voltage between the selected word line WL and the channel of the NAND string NS corresponding to the write target bit line BL, leading to an increase in the threshold voltage of each memory cell transistor MT.

At this time, the difference in voltage between the selected word line WL and the channel of the NAND string NS corresponding to the write target bit line BL varies according to the written level and the results of the "VL" verify.

Specifically, for each written level, the amount of increase in the threshold voltage of each memory cell transistor MT resulting from the application of the program voltage VPGM to the selected word line WL is smaller for the memory cell transistors MT which have passed the "VL" verify but have not passed the "VH" verify yet than for the memory cell transistors MT which have not passed the "VL" verify yet.

On the other hand, for the write inhibited memory cell transistors MT, a variation in the threshold voltage is suppressed, for example, by the self-boost technique.

Then, when the row decoder 13 returns the voltage of the selected word line WL to VSS and the sense amplifier module 12 returns the voltage of each bit line BL to VSS, the sequencer 17 shifts from the program operation to the verify operation. This verify operation is similar to the verify operation in the first program loop, and thus, description thereof is omitted.

The above-described operations correspond to the second program loop. Then, the sequencer 17 steps up the program voltage VPGM and repeatedly executes program loops similar to the second program loop. Other operations of the semiconductor memory device 10 according to the second embodiment are similar to corresponding operations included in the write operation of the semiconductor memory device according to the first embodiment. Thus, the description thereof is omitted.

In the above-described example, in the second and subsequent program loops, the program operation using the voltage QA, the voltage QB, and the voltage QC is performed. However, the present invention is not limited to this. For example, the program operation using the voltage QA may be performed after any of the "A" write memory cell transistors MT passes the "VL" verify for the first time. The program operation using the voltage QB may be performed after any of the "B" write memory cell transistors MT passes the "VL" verify for the first time. The program operation using the voltage QC may be performed after any of the "C" write memory cell transistors MT passes the "VL" verify for the first time.

Figure 10:
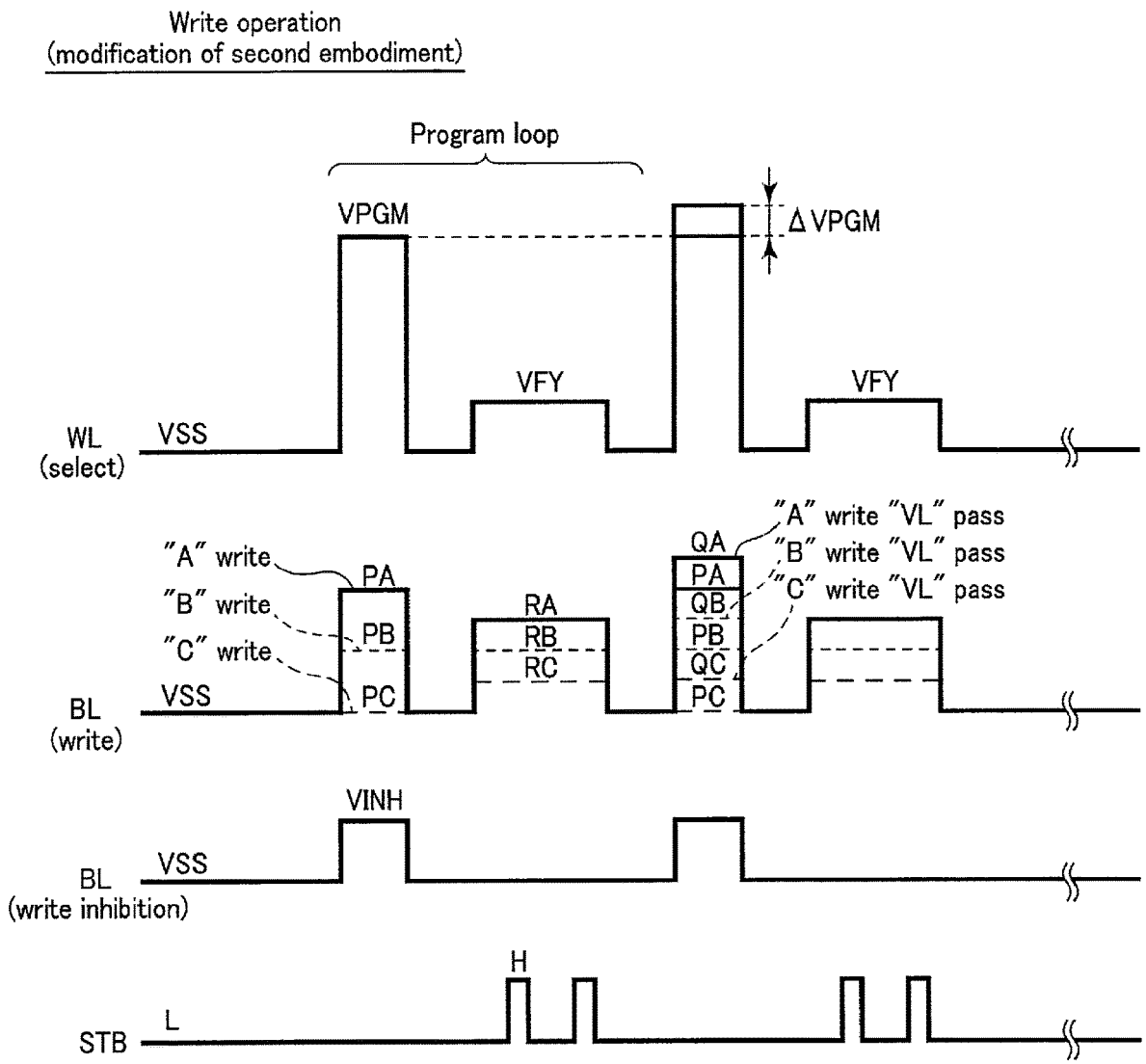
FIG. 10 is a diagram illustrating examples of voltages applied to various interconnects during a write operation of a semiconductor memory device according to a modification of the second embodiment.

Furthermore, one type of verify voltage may be used for the write operation using the QPW method. FIG. 10 illustrates examples of voltages applied to the word line WL and the bit lines BL and a variation in the control signal STB, in the write operation using the QPW method. The modification of the write operation illustrated in FIG. 10 is different from the write operation described using FIG. 9 in detailed operations during the verify operation.

Specifically, the verify operation in the modification uses one verify voltage VFY. Furthermore, the voltages of the bit lines BL during the application of the verify voltage VFY to the selected word line WL are similar to the voltages of the bit lines BL in the write operation described using FIG. 9.

For the write operation in the modification, the sequencer 17 asserts the control signal STB twice during the verify operation in one program loop. The first assert corresponds to the "VL" verify, and the second assert corresponds to the "VH" verify. The sequencer 17 thus varies the sense timing between the "VL" verify and the "VH" verify, and sets a threshold for the amount of current to be sensed, allowing verify corresponding to two types of voltages to be executed using the combination of the same verify voltage VFY and the same bit line BL voltage.

[2-2] Effects of the Second Embodiment

As described above, the semiconductor memory device 10 according to the second embodiment performs the write operation corresponding to the write operation in the first embodiment to which the QPW method is applied. Since the QPW method is applied to the write operation in the second embodiment, the threshold distributions of the memory cell transistors MT are narrower than those in the first embodiment.

Consequently, the semiconductor memory device 10 according to the second embodiment can reduce the number of error bits in the read operation compared to the semiconductor memory device 10 according to the first embodiment. In other words, the semiconductor memory device 10 according to the second embodiment can improve the reliability of written data compared to the semiconductor memory device 10 according to the first embodiment.

Furthermore, the write operation in the second embodiment uses the verify voltages VFYL and VFYH for the "VL" verify and "VH" verify in the QPW method to adjust the voltages applied to the bit lines BL according to the threshold voltage for determination.

Specifically, the semiconductor memory device 10 according to the second embodiment uses a method similar to that of the first embodiment to form the state of the "VL" verify for each of the "A" write, the "B" write, and the "C" write during the application of the verify voltage VFYL, while forming the state of the "VH" verify for each of the "A" write, the "B" write, and the "C" write during the application of the verify voltage VFYH.

As a result, the semiconductor memory device 10 according to the second embodiment can perform each of the sets of "VL" verify operations and "VH" verify operations corresponding to the plurality of levels at a time by asserting the control signal STB twice. Therefore, the semiconductor memory device 10 according to the second embodiment enables a reduction in the duration of the verify operation in the write operation using the QPW method, allowing a faster write operation to be achieved.

3 Third Embodiment

A semiconductor memory device 10 according to a third embodiment is configured similarly to the semiconductor memory device 10 according to the first embodiment. The semiconductor memory device 10 according to the third embodiment performs a write operation similar to that in the first embodiment while applying the TLC method as a write method.

[3-1] Operation

Figure 11:
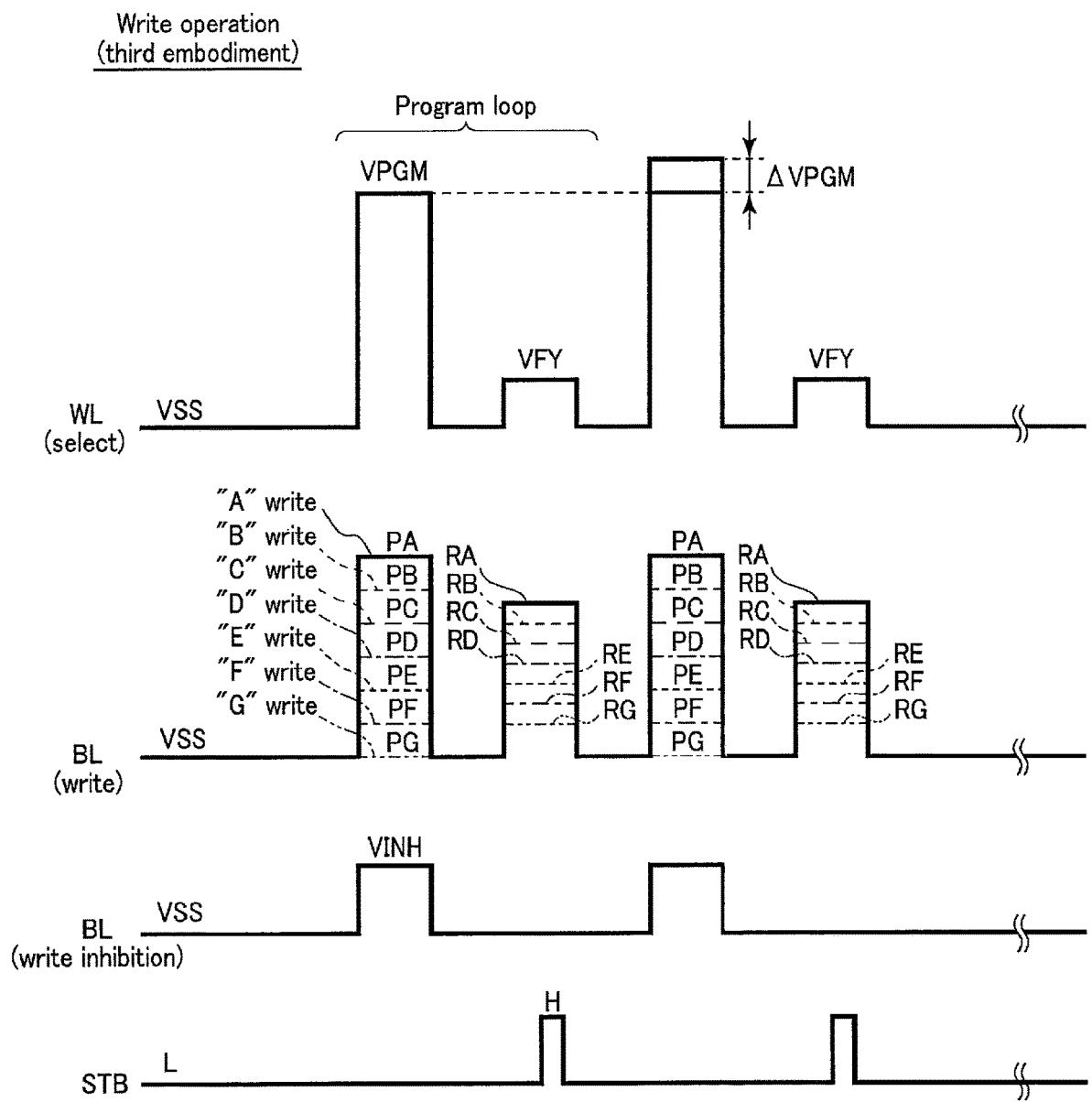
FIG. 11 is a diagram illustrating examples of voltages applied to various interconnects during a write operation of a semiconductor memory device according to a third embodiment.

FIG. 11 illustrates examples of voltages applied to the word line WL and the bit lines BL, respectively, and a variation in the control signal STB, in a write operation of the semiconductor memory device 10 according to the third embodiment.

In the description below, "D" write, "E" write, "F" write, and "G" write memory cell transistors MT refer to write target memory cell transistors MT to which data corresponding to a "D" level, an "E" level, an "F" level, and a "G" level are to be written in order to increase threshold voltages to the "D" level, the "E" level, the "F" level, and the "G" level, respectively. "D" write, "E" write, "F" write, and "G" write bit lines BL refer to the bit lines BL connected to the "D" write, "E" write, "F" write, and "G" write memory cell transistors MT, respectively.

In the description below, "D" verify, "E" verify, "F" verify, and "G" verify refer to operations included in the verify operation and in which the sense amplifier module 12 determines whether the threshold voltages of the memory cell transistors MT corresponding to the "D" write, "E" write, "F" write, and "G" write exceed the "D" level, the "E" level, the "F" level, and the "G" level, respectively.

As illustrated in FIG. 11, when the write operation is started, first, the sequencer 17 performs the program operation. In the program operation, the sense amplifier module 12 applies the voltage PA to the "A" write bit lines BL, applies the voltage PB to the "B" write bit lines BL, applies the voltage PC to the "C" write bit lines BL, applies the voltage PD to the "D" write bit lines BL, applies the voltage PE to the "E" write bit lines BL, applies the voltage PF to the "F" write bit lines BL, applies the voltage PG to the "G" write bit lines BL, and the voltage PINH to the write inhibited bit lines. The relationship among these voltage values is PG<PF<PE<PD<PC<PB<PA<VINH. When the voltage VINH is applied to the write inhibited bit lines BL, the channel of the corresponding NAND string NS becomes the floating state.

Then, the row decoder 13 applies the program voltage VPGM to the selected word line WL. When the program voltage VPGM is applied to the selected word line WL, electrons are injected into the charge storage layer of each write target memory cell transistor MT due to a difference in voltage between the selected word line WL and the channel of the NAND string NS corresponding to the write target bit line BL, leading to an increase in the threshold voltage of each memory cell transistor MT.

At this time, the difference in voltage between the selected word line WL and the channel of the NAND string NS corresponding to the write target bit line BL varies according to the written level. A lower voltage of the bit line BL corresponds to a greater difference from the program voltage VPGM. Thus, the amount of increase in the threshold voltage of each memory cell transistor MT to which the program voltage VPGM is applied increases in order of "A" write<"B" write<"C" write<"D" write<"E" write<"F" write<"G" write.

On the other hand, for the write inhibited memory cell transistors MT, a variation in the threshold voltage is suppressed, for example, by the self-boost technique.

Then, when the row decoder 13 returns the voltage of the selected word line WL to VSS and the sense amplifier module 12 returns the voltage of each bit line BL to VSS, the sequencer 17 shifts from the program operation to the verify operation.

In the verify operation, the sense amplifier module 12 applies the voltage RA to the "A" write bit lines BL, applies the voltage RB to the "B" write bit lines BL, applies the voltage RC to the "C" write bit lines BL, applies the voltage RD to the "D" write bit lines BL, applies the voltage RE to the "E" write bit lines BL, applies the voltage RF to the "F" write bit lines BL, and applies the voltage RG to the "G" write bit lines BL. The relationship among these voltage values is RG<RF<RE<RD<RC<RB<RA. The row decoder 13 applies, for example, the verify voltage VFY to the selected word line WL.

As described above, the difference in voltage between the selected word line WL and the channel of the NAND string NS corresponding to the write target bit line BL varies according to the target level of the verify operation.

Specifically, the difference between the voltage RA and the verify voltage VFY is set to correspond to the difference between the voltage VBL and the verify voltage AV. The difference between the voltage RB and the verify voltage VFY is set to correspond to the difference between the voltage VBL and the verify voltage BV. The difference between the voltage RC and the verify voltage VFY is set to correspond to the difference between the voltage VBL and the verify voltage CV. The difference between the voltage RD and the verify voltage VFY is set to correspond to the difference between the voltage VBL and the verify voltage DV. The difference between the voltage RE and the verify voltage VFY is set to correspond to the difference between the voltage VBL and the verify voltage EV. The difference between the voltage RF and the verify voltage VFY is set to correspond to the difference between the voltage VBL and the verify voltage FV. The difference between the voltage RG and the verify voltage VFY is set to correspond to the difference between the voltage VBL and the verify voltage GV.

Then, the sequencer 17 asserts the control signal STB. When the control signal STB is asserted, the sense amplifier module 12 performs, at a time, an operation of determining whether the threshold voltage of each "A" write memory cell transistor MT has exceeded the voltage AV, an operation of determining whether the threshold voltage of each "B" write memory cell transistor MT has exceeded the voltage BV, an operation of determining whether the threshold voltage of each "C" write memory cell transistor MT has exceeded the voltage CV, an operation of determining whether the threshold voltage of each "D" write memory cell transistor MT has exceeded the voltage DV, an operation of determining whether the threshold voltage of each "E" write memory cell transistor MT has exceeded the voltage EV, an operation of determining whether the threshold voltage of each "F" write memory cell transistor MT has exceeded the voltage FV, and an operation of determining whether the threshold voltage of each "G" write memory cell transistor MT has exceeded the voltage GV.

The above-described program operation and verify operation correspond to one program loop. Other operations of the semiconductor memory device 10 according to the third embodiment are similar to corresponding operations included in the write operation of the semiconductor memory device 10 according to the first embodiment, and thus, description thereof is omitted.

[3-2] Effects of the Third Embodiment

As described above, the semiconductor memory device 10 according to the third embodiment performs a write operation with the TLC method applied thereto which is similar to the write operation in the first embodiment.

As a result, like the semiconductor memory device 10 according to the first embodiment, the semiconductor memory device 10 according to the third embodiment can suppress the adverse effect of program disturb in the program operation and can thus restrain the extension of the threshold distributions.

Furthermore, like the semiconductor memory device 10 according to the first embodiment, the semiconductor memory device 10 according to the third embodiment can set effective write voltages corresponding to threshold voltages for the "A" write, the "B" write, the "C" write, the "D" write, the "E" write, and the "F" write by using the program voltage VPGM optimized for the "G" write involving the highest threshold voltage, and adjusting the voltage of each bit line BL.

Therefore, like the semiconductor memory device 10 according to the first embodiment, the semiconductor memory device 10 according to the third embodiment can improve the reliability of written data and achieve a faster write operation.

Furthermore, the semiconductor memory device 10 according to the third embodiment can perform verify operations corresponding to a plurality of levels at a time by asserting the control signal STB once. Therefore, the write operation of the semiconductor memory device 10 according to the third embodiment enables a reduction in the duration of the verify operation, allowing a faster write operation to be achieved, as is the case with the semiconductor memory device 10 according to the first embodiment.

The semiconductor memory device 10 can perform a write operation similar to that in the first embodiment even when a write method in which 4 or more bits of data are stored in one memory cell transistor MT is applied as a write method for the memory cell transistors MT. Also in such a case, the semiconductor memory device 10 can improve the reliability of written data and achieve a faster write operation like the semiconductor memory device 10 according to the first embodiment.

4 Fourth Embodiment

A semiconductor memory device 10 according to a fourth embodiment is configured similarly to the semiconductor memory device 10 according to the first embodiment. In the semiconductor memory device 10 according to the fourth embodiment, a double pulse method is applied to the write operation described in the third embodiment.

[4-1] Operation

The double pulse method is applied to the write operation of the semiconductor memory device 10 according to the fourth embodiment, and the write target memory cell transistors MT are classified into two groups according to the written level. During the write operation to which the double pulse method is applied, two types of program voltages VPGM are applied in one program loop to allow different program operations to be performed on the respective groups.

Specifically, during the write operation in the fourth embodiment, the sequencer 17, for example, performs different program operations on a first group including the "A" write, "B" write, "C" write, and "D" write memory cell transistors MT and a second group including the "E" write, "F" write, and "G" write memory cell transistors MT.

The grouping of the write target memory cell transistors MT based on the double pulse method may be any other combinations of the write target memory cell transistors MT, and any set number of write levels may be assigned to each group. For example, the memory cell transistors MT each with a lower target threshold voltage may be assigned to the first group, and the memory cell transistors MT each with a higher target threshold voltage may be assigned to the second group.

FIG. 12 illustrates examples of voltages applied to the word line WL and the bit lines BL, respectively, and a variation in the control signal STB, in the write operation of the semiconductor memory device 10 according to the fourth embodiment.

As illustrated in FIG. 12, first, the sequencer 17, for example, sets the memory cell transistors MT in the second group including the "E" write, "F" write, and "G" write memory cell transistors MT to the write inhibition state, while performing the program operation on the memory cell transistors MT in the first group including the "A" write, "B" write, "C" write, and "D" write memory cell transistors MT.

Specifically, the sense amplifier module 12 applies the voltage PA to the "A" write bit lines BL, applies the voltage PB to the "B" write bit lines BL, applies the voltage PC to the "C" write bit lines BL, applies the voltage PD to the "D" write bit lines BL, and applies the voltage VINH to the write inhibited bit lines BL. The relationship among these voltage values is PD<PC<PB<PA<VINH. When the voltage VINH is applied to the write inhibited bit lines BL, the channel of the corresponding NAND string NS becomes the floating state.

Then, the row decoder 13 applies a program voltage VPGM1 to the selected word line WL. The program voltage VPGM1 is a high voltage which enables an increase in the threshold voltage of each memory cell transistor MT. When the program voltage VPGM1 is applied to the selected word line WL, electrons are injected into the charge storage layer of each write target memory cell transistor MT due to a difference in voltage between the selected word line WL and the channel of the NAND string NS corresponding to the write target bit line BL, leading to an increase in the threshold voltage of each memory cell transistor MT.

At this time, the difference in voltage between the selected word line WL and the channel of the NAND string NS corresponding to the write target bit line BL varies according to the written level. A lower voltage of the bit line BL corresponds to a greater difference from the program voltage VPGM. Thus, the amount of increase in the threshold voltage of each memory cell transistor MT to which the program voltage VPGM is applied increases in order of "A" write<"B" write<"C" write<"D" write.

On the other hand, for the write inhibited memory cell transistors MT, a variation in the threshold voltage is suppressed, for example, by the self-boost technique.

Then, when the row decoder 13 reduces the voltage of the selected word line WL to VSS and the sense amplifier module 12 reduces the voltage of each bit line BL to VSS, for example, the sequencer 17 then sets the memory cell transistors MT in the first group including the "A" write, "B" write, "C" group, and "D" write memory cell transistors MT to the write inhibition state, while performing the program operation on the memory cell transistors MT in the second group including the "E" write, "F" write, and "G" write memory cell transistors MT.

Specifically, the sense amplifier module 12 applies the voltage PE to the "E" write bit lines BL, applies the voltage PF to the "F" write bit lines BL, applies the voltage PG to the "G" write bit lines BL, and applies the voltage VINH to the write inhibited bit lines BL. The relationship among these voltage values is PG<PF<PE<VINH. When the voltage VINH is applied to the write inhibited bit lines BL, the channel of the corresponding NAND string NS becomes the floating state.

Then, the row decoder 13 applies a program voltage VPGM2 to the selected word line WL. The program voltage VPGM2 is a voltage higher than the program voltage VPGM1. When the program voltage VPGM2 is applied to the selected word line WL, electrons are injected into the charge storage layer of each write target memory cell transistor MT due to a difference in voltage between the selected word line WL and the channel of the NAND string NS corresponding to the write target bit line BL, leading to an increase in the threshold voltage of each memory cell transistor MT.

At this time, the difference in voltage between the selected word line WL and the channel of the NAND string NS corresponding to the write target bit line BL varies according to the written level. A lower voltage of the bit line BL corresponds to a greater difference from the program voltage VPGM. Thus, the amount of increase in the threshold voltage of each memory cell transistor MT to which the program voltage VPGM is applied increases in order of "E" write<"F" write<"G" write.

On the other hand, for the write inhibited memory cell transistors MT, a variation in the threshold voltage is suppressed, for example, by the self-boost technique.

Then, when the row decoder 13 reduces the voltage of the selected word line WL to VSS and the sense amplifier module 12 reduces the voltage of each bit line BL to VSS, the sequencer 17 shifts from the program operation to the verify operation. Other operations of the semiconductor memory device 10 according to the fourth embodiment are similar to corresponding operations included in the write operation of the semiconductor memory device 10 according to the third embodiment, and thus, description thereof is omitted.

[4-2] Effects of the Fourth Embodiment

As described above, the semiconductor memory device 10 according to the fourth embodiment performs a write operation with the double pulse method applied thereto which is similar to the write operation in the first embodiment. Consequently, the write operation in the fourth embodiment enables the timing when the memory cell transistors MT in the first group pass the verify to be more accurately synchronized with the timing when the memory cell transistors MT in the second group pass the verify, than the write operation of the semiconductor memory device 10 according to the third embodiment.

As a result, the semiconductor memory device 10 according to the fourth embodiment can more effectively suppress the adverse effect of program disturb in the program operation and restrain the extension of the threshold distributions than the semiconductor memory device 10 according to the third embodiment. Therefore, the semiconductor memory device 10 according to the fourth embodiment can more effectively reduce the number of error bits in the read operation and improve the reliability of written data than the semiconductor memory device 10 according to the third embodiment.

Furthermore, the semiconductor memory device 10 according to the fourth embodiment can perform verify operations corresponding to a plurality of levels at a time by asserting the control signal STB once. Therefore, the write operation of the semiconductor memory device 10 according to the fourth embodiment enables a reduction in the duration of the verify operation, allowing a faster write operation to be achieved, as is the case with the semiconductor memory device 10 according to the first embodiment.

In the above-described example, the TLC method and the double pulse method are applied as the write method. However, the present invention is not limited to this. For example, the semiconductor memory device 10 can perform a write operation similar to that in the third embodiment even if a write method is applied in which 4 or more bits of data are stored in one memory cell transistors MT. Furthermore, the semiconductor memory device 10 can perform a write operation similar to that in the first embodiment even if a triple pulse method is applied to the write operation.

In a triple pulse-based write operation, the write target memory cell transistors MT are classified into three groups according to the written level. During the write operation to which the triple pulse method is applied, three types of program voltages VPGM are applied in one program loop to allow different program operations to be performed on the respective groups.

Also in such a case, the semiconductor memory device 10 can improve the reliability of written data and achieve a faster write operation like the semiconductor memory device 10 according to the first embodiment, by changing, as necessary, the grouping of the write target memory cell transistors MT and the voltages applied to the bit lines BL corresponding to the respective groups.

5 Fifth Embodiment

A semiconductor memory device 10 according to a fifth embodiment is configured similarly to the semiconductor memory device 10 according to the first embodiment. In the semiconductor memory device 10 according to the fifth embodiment, a plurality of verify voltages is used for the write operation described in the third embodiment.

[5-1] Operation

Figure 13:
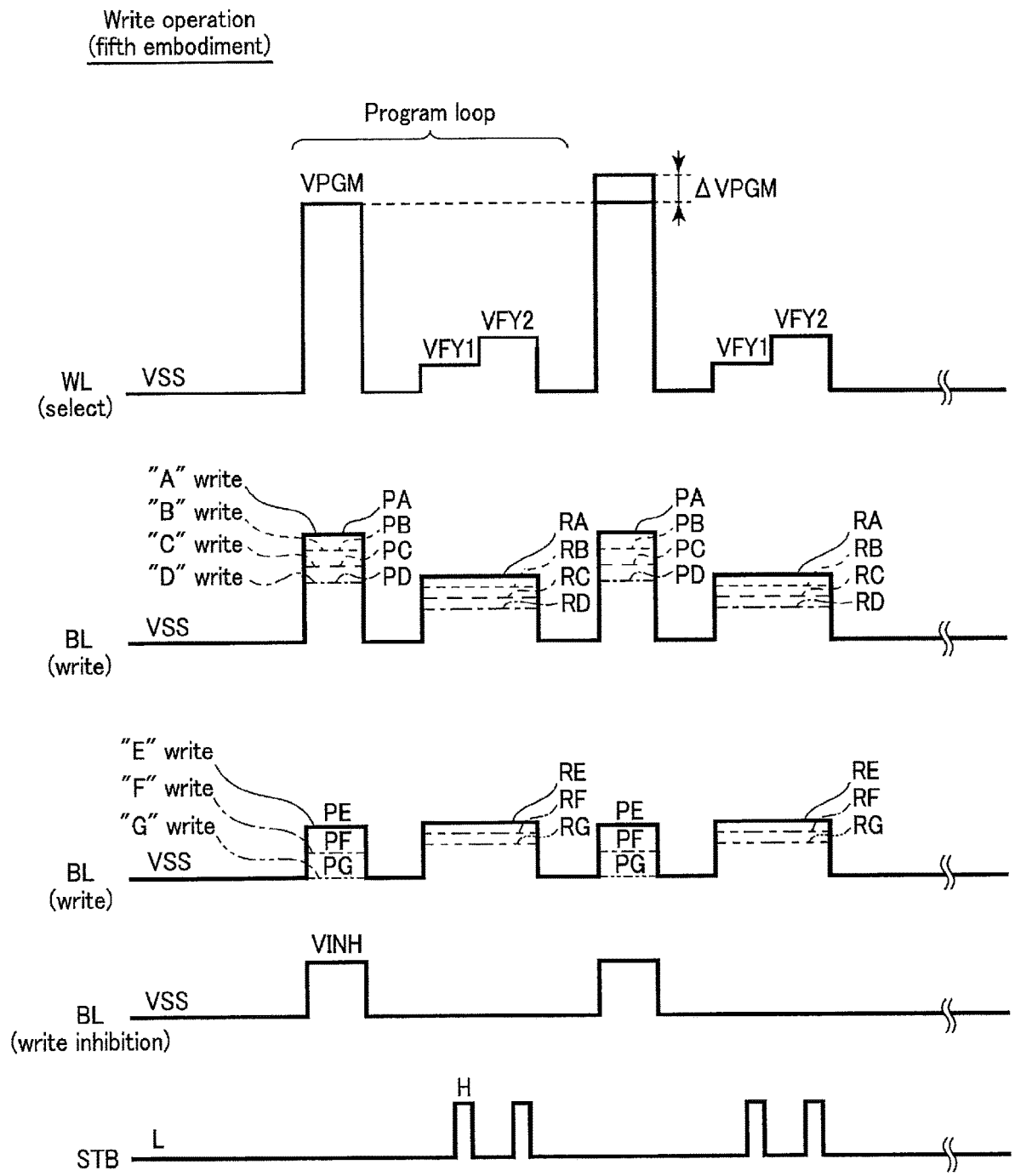
FIG. 13 is a diagram illustrating examples of voltages applied to various interconnects during a write operation of a semiconductor memory device according to a fifth embodiment.

FIG. 13 illustrates examples of voltages applied to the word line WL and the bit lines BL, respectively, and a variation in the control signal STB, in a write operation of the semiconductor memory device 10 according to the fifth embodiment.

As illustrated in FIG. 13, when the write operation is started, first, the sequencer 17 performs the program operation. This program operation is similar to the program operation described using FIG. 11, and thus, description thereof is omitted.

When the program operation ends, the sequencer 17 then performs the verify operation. In the verify operation, the sense amplifier module 12 applies the voltage RA to the "A" write bit lines BL, applies the voltage RB to the "B" write bit lines BL, applies the voltage RC to the "C" write bit lines BL, and applies the voltage RD to the "D" write bit lines BL. The relationship among these voltage values is RD<RC<RB<RA.

The sense amplifier module 12 also applies the voltage RE to the "E" write bit lines BL, applies the voltage RF to the "F" write bit lines BL, and applies the voltage RG to the "G" write bit lines BL. The relationship among these voltage values is RG<RF<RE.

Then, the row decoder 13 applies, for example, the verify voltage VFY1 and the verify voltage VFY2 consecutively to the selected word line WL. The verify voltage VFY2 is a voltage higher than the verify voltage VFY1.

As described above, the difference in voltage between the selected word line WL and the channel of the NAND string NS corresponding to the write target bit line BL varies according to the target level of the verify operation.

Specifically, the difference between the voltage RA and the verify voltage VFY1 is set to correspond to the difference between the voltage VBL and the verify voltage AV. The difference between the voltage RB and the verify voltage VFY1 is set to correspond to the difference between the voltage VBL and the verify voltage BV. The difference between the voltage RC and the verify voltage VFY1 is set to correspond to the difference between the voltage VBL and the verify voltage CV. The difference between the voltage RD and the verify voltage VFY1 is set to correspond to the difference between the voltage VBL and the verify voltage DV.

The difference between the voltage RE and the verify voltage VFY2 is set to correspond to the difference between the voltage VBL and the verify voltage EV. The difference between the voltage RF and the verify voltage VFY2 is set to correspond to the difference between the voltage VBL and the verify voltage FV. The difference between the voltage RG and the verify voltage VFY2 is set to correspond to the difference between the voltage VBL and the verify voltage GV.

Then, the sequencer 17 asserts the control signal STB while each of the verify voltages VFY1 and VFY2 is being applied.

When the control signal STB is asserted while the verify voltage VFY1 is being applied to the selected word line WL, the sense amplifier module 12 performs the "A" verify, the "B" verify, the "C" verify, and the "D" verify at a time.

When the control signal STB is asserted while the verify voltage VFY2 is being applied to the selected word line WL, the sense amplifier module 12 performs the "E" verify, the "F" verify, and the "G" verify at a time.

The above-described program operation and verify operation correspond to one program loop. Other operations of the semiconductor memory device 10 according to the fifth embodiment are similar to corresponding operations included in the write operation of the semiconductor memory device 10 according to the third embodiment, and thus, description thereof is omitted.

In the above-described example, the write target bit lines BL are classified into the group including the bit lines BL corresponding to the "A" write, the "B" write, the "C" write, and the "D" write, respectively, and the group including the bit lines BL corresponding to the "E" write, the "F" write, and the "G" write, respectively. However, the present invention is not limited to this.

For example, the "D" write bit lines BL may be included in the group including the bit lines BL corresponding to the "E" write, the "F" write, and the "G" write, respectively. In this case, the difference between the voltage RD and the verify voltage VFY2 is set to correspond to the difference between the VBL and the verify voltage DV. In this manner, the combination of elements corresponding to each write level can be changed as necessary.

Furthermore, in the above-described example, during the verify operation, the voltage RE is applied to the "E" write bit lines BL, the voltage RF is applied to the "F" write bit lines BL, and the voltage RG is applied to the "G" write bit lines BL, while the verify voltage VFY1 is being applied to the selected word line WL. However, the present invention is not limited to this.

For example, the ground voltage VSS may be applied to each of the "E" write, "F" write, and "G" write bit lines BL while the verify voltage VFY1 is being applied to the selected word line WL. Similarly, the ground voltage VSS may be applied to each of the "A" write, "B" write, "C" write, and "G" write bit lines BL while the verify voltage VFY2 is being applied to the selected word line WL. In this manner, at the timing when the control signal STB is asserted, the voltages of the bit lines BL corresponding to the memory cell transistors MT on which verify is not executed can be set to any values.

Furthermore, during the verify operation in the write operation of the semiconductor memory device 10 according to the fifth embodiment, the number of verify voltages applied in one program loop may be varied with progression of the write operation. FIG. 14 illustrates examples of voltages applied to the word line WL and the bit lines BL, respectively, and a variation in the control signal STB, in the write operation as described above. In the example illustrated in FIG. 14, the period from start till end of the write operation is divided into three periods.

In the first program loop during the first period following the start of the write operation, the sequencer 17 performs a verify operation using the verify voltage VFY1.

Specifically, the sense amplifier module 12 applies the voltage RA to the "A" write bit lines BL, applies the voltage RB to the "B" write bit lines BL, applies the voltage RC to the "C" write bit lines BL, applies the voltage RD to the "D" write bit lines BL, and applies the ground voltage VSS to the bit lines BL corresponding to the "E" write, the "F" write, and the "G" write.

Then, the row decoder 13 applies the verify voltage VFY1 to the selected word line WL, and the sequencer 17 asserts the control signal STB while the verify voltage VFY1 is being applied. In other words, the "A" verify, the "B" verify, the "C" verify, and the "D" verify are executed at a time.

When the first program loop is executed a prescribed number of times to increase the threshold voltage of each write target memory cell transistor MT to some degree, the write operation shifts from the first period to the second period. In the second program loop during the second period, the sequencer 17 performs a verify operation using each of the verify voltages VFY1 and VFY2. This verify operation is similar to the verify operation in the write operation described using FIG. 13, and thus, description thereof is omitted.

When the second program loop is executed a prescribed number of times to end the "A" write, the "B" write, the "C" write, and the "D" write, the write operation shifts from the second period to the third period. In the third program loop during the third period, the sequencer 17 performs a verify operation using the verify voltage VFY2.

Specifically, the sense amplifier module 12 applies the voltage RE to the "E" write bit lines BL, applies the voltage RF to the "F" write bit lines BL, applies the voltage RG to the "G" write bit lines BL, and applies the ground voltage VSS to the bit lines BL connected to the memory cell transistors MT with the "A" write, "B" write, "C" write, and "D" write thereto completed.

Then, the row decoder 13 applies the verify voltage VFY2 to the selected word line WL, and the sequencer 17 asserts the control signal STB while the verify voltage VFY2 is being applied. In other words, the "E" verify, the "F" verify, and the "G" verify are executed at a time.

As described above, the semiconductor memory device 10 according to the fifth embodiment can select the appropriate verify operation as necessary with progression of the write operation.

[5-2] Effects of the Fifth Embodiment

As described above, the semiconductor memory device 10 according to the fifth embodiment uses the two types of verify voltages VFY1 and VFY2 for the write operation described in the third embodiment. In this case, the number of types of voltages of the bit lines BL used during the verify operation of the semiconductor memory device 10 according to the fifth embodiment is smaller than the number of types of voltages of the bit lines BL used during the verify operation described in the third embodiment.

Consequently, during the write operation, the semiconductor memory device 10 according to the fifth embodiment can control the bit line BL voltages more simply than the semiconductor memory device 10 according to the third embodiment. Therefore, the semiconductor memory device 10 according to the fifth embodiment allows the sequencer 17 and the sense amplifier module 12 to be designed more simply than the semiconductor memory device 10 according to the third embodiment. This enables a reduction in design costs of the semiconductor memory device 10.

Furthermore, the semiconductor memory device 10 according to the fifth embodiment performs verify operations corresponding to a plurality of levels at a time by asserting the control signal STB twice. Also in such a case, the time needed for the verify operation is shorter than that in a case where, for each written level, the corresponding verify is executed. Therefore, the write operation of the semiconductor memory device according to the fifth embodiment enables a reduction in the duration of the verify operation, thus allowing a faster write operation to be achieved.

Similar write operation as described above with reference to the fifth embodiment can be performed where write method which stores 2 bits or 4 bits or more data in one memory cell transistor MT is applied.

Also in such a case, the semiconductor memory device 10 can produce effects similar to those of the fifth embodiment by setting, as necessary, the combination of the verify voltage used and the bit lines BL corresponding to the write level to be verified. Thus, the semiconductor memory device 10 can improve the reliability of written data and achieve a faster write operation.

6 Sixth Embodiment

A semiconductor memory device 10 according to a sixth embodiment is configured similarly to the semiconductor memory device 10 according to the first embodiment. The semiconductor memory device 10 according to the sixth embodiment applies batch read for a plurality of levels described in the first embodiment, to a search read.

[6-1] Operation

[6-1-1] Search Read and Corrected Read

FIG. 15 illustrates examples of threshold distributions of the memory cell transistors MT corresponding to the "ER" level and the "A" level resulting from the write operation. Solid lines are indicative of ideal threshold distributions, and dashed lines are indicative of actual threshold distributions. FIG. 15 illustrates examples of read voltages used by the semiconductor memory device 10 to execute a search read.

The threshold distributions resulting from the write operation may be different from the ideal threshold distributions as illustrated in FIG. 15. For example, after the write operation, in each memory cell transistor MT, the threshold voltage may be reduced by loss of electrons from the charge storage layer over time or may be increased by program disturb or read disturb. If the threshold distributions are extended as a result of such a variation in threshold voltage, the use of a preset read voltage (for example, the read voltage AR) is likely to cause erroneous read.

In contrast, the semiconductor memory device 10, for example, performs re-reading on a relevant page when the number of error bits in the read operation has exceeded a prescribed value, and in the re-reading, first executes a search read.

The search read refers to a read operation of searching for the optimal read voltage between adjacent threshold distributions. For example, the search read between the "ER" level and the "A" level uses six search read voltages ARs1, ARs2, ARs3, ARs4, ARs5, and ARs6.

These voltage values are set to any values, and the intervals between adjacent search read voltages are set to, for example, to an approximately constant value. The relationship among the voltage values is ARs1<ARs2<ARs3<ARs4<ARs5<ARs6. The relationship between the prescribed read voltage AR and these voltage values is ARs1<AR<ARs6. For each of other read voltages, a search read voltage is set.

FIG. 16 illustrates examples of voltages applied to the word line WL and the bit lines BL, respectively, and a variation in the control signal STB, in a case where one page of data is obtained by read operations with the read voltages AR and ER and where search reads corresponding to the read voltages AR and ER are consecutively executed.

When the search read is started, first, the sequencer 17 executes a search read corresponding to the read voltage AR (AR search) as illustrated in FIG. 16.

Specifically, the sense amplifier module 12 applies the voltage VBL to the bit lines BL connected to read target memory cell transistors MT. The row decoder 13 applies the search read voltages ARs1, ARs2, ARs3, ARs4, ARs5, and ARs6 to the selected word line WL in this order.

The sequencer 17 asserts the control signal STB while each of the search read voltages ARs1 to ARs6 is being applied. When the control signal STB is asserted, the sense amplifier module 12 holds the results of the read with the search read voltages ARs1 to ARs6 in the respective latch circuits in the sense amplifier module 12.

The sequencer 17 then calculates a corrected read voltage ARcal based on the results of the read with the search read voltages ARs1 to ARs6.

Specifically, the sequencer 17 sets the corrected read voltage ARcal in such a manner as to minimize the number of error bits in a read operation of determining whether the threshold voltage of each memory cell transistor MT is included in the "ER" level or in the "A" level or more.

More specifically, the sequencer 17 calculates the difference between the number of on cells resulting from the search read voltage ARs1 and the number of on cells resulting from the search read voltage ARs2. Similarly, the sequencer 17 calculates the difference in the number of on cells between the search read voltage ARs2 and the search read voltage ARs3, the difference in the number of on cells between the search read voltage ARs3 and the search read voltage ARs4, the difference in the number of on cells between the search read voltage ARs4 and the search read voltage ARs5, and the difference in the number of on cells between the search read voltage ARs5 and the search read voltage ARs6. The sequencer 17 then checks the amount of variation in the number of on cells using a certain threshold to roughly calculate the shape of the threshold distribution of the memory cell transistors MT, and based on the results of the calculation, sets the corrected read voltage ARcal.

The sequencer 17 then executes a search read (ER search) corresponding to the read voltage ER. This operation is similar to the search read corresponding to the read voltage AR.

Specifically, the row decoder 13 applies search read voltages ERs1, ERs2, ERs3, ERs4, ERs5, and ERs6 to the selected word line WL in this order. The sequencer 17 asserts the control signal STB while each of the search read voltages ERs1 to ERs6 is being applied. When the control signal STB is asserted, the sense amplifier module 12 holds the results of the read with the search read voltages ERs1 to ERs6 in the respective latch circuits in the sense amplifier module 12.

The sequencer 17 then calculates a corrected read voltage ERcal based on the results of the read with the search read voltages ERs1 to ERs6.

As described above, when the corrected read voltage ARcal corresponding to the read voltage AR and the corrected read voltage ERcal corresponding to the read voltage ER are calculated as described above, for example, the sequencer 17 then executes a corrected read.

The corrected read refers to a read operation using the corrected read voltage calculated by the search read. Specifically, for example, the sense amplifier module 12 applies the voltage VBL to each read target bit line BL. The row decoder 13 applies the corrected read voltages ARcal and ERcal to the selected word line WL in this order. The sequencer 17 asserts the control signal STB while each of the corrected read voltages ARcal and ERcal is being applied. When the control signal STB is asserted, the sense amplifier module 12 holds the results of the read with the corrected read voltages ARcal and ERcal in the latch circuits in the sense amplifier module 12.

When the semiconductor memory device 10 executes the corrected read based on the results of the search read, the number of error bits in the relevant page is reduced. In other words, for pages with a large number of error bits, the semiconductor memory device 10 can accurately read data from the page by executing the search read and the corrected read as re-reading.

The voltage values and the number of voltage values for the search read voltage described above are illustrative and not limitative.

The semiconductor memory device 10 may set search read voltage with any voltage value and number in accordance with each read voltage.

For example, the semiconductor memory device 10 may transfer the read results of the search read to an external memory controller, which may then calculate the corrected read voltages. In this case, the semiconductor memory device 10 executes the corrected read using the read voltages specified by the memory controller.

[6-1-2] Search Read with Batch Read for a Plurality of Levels Applied Thereto

Figure 17:
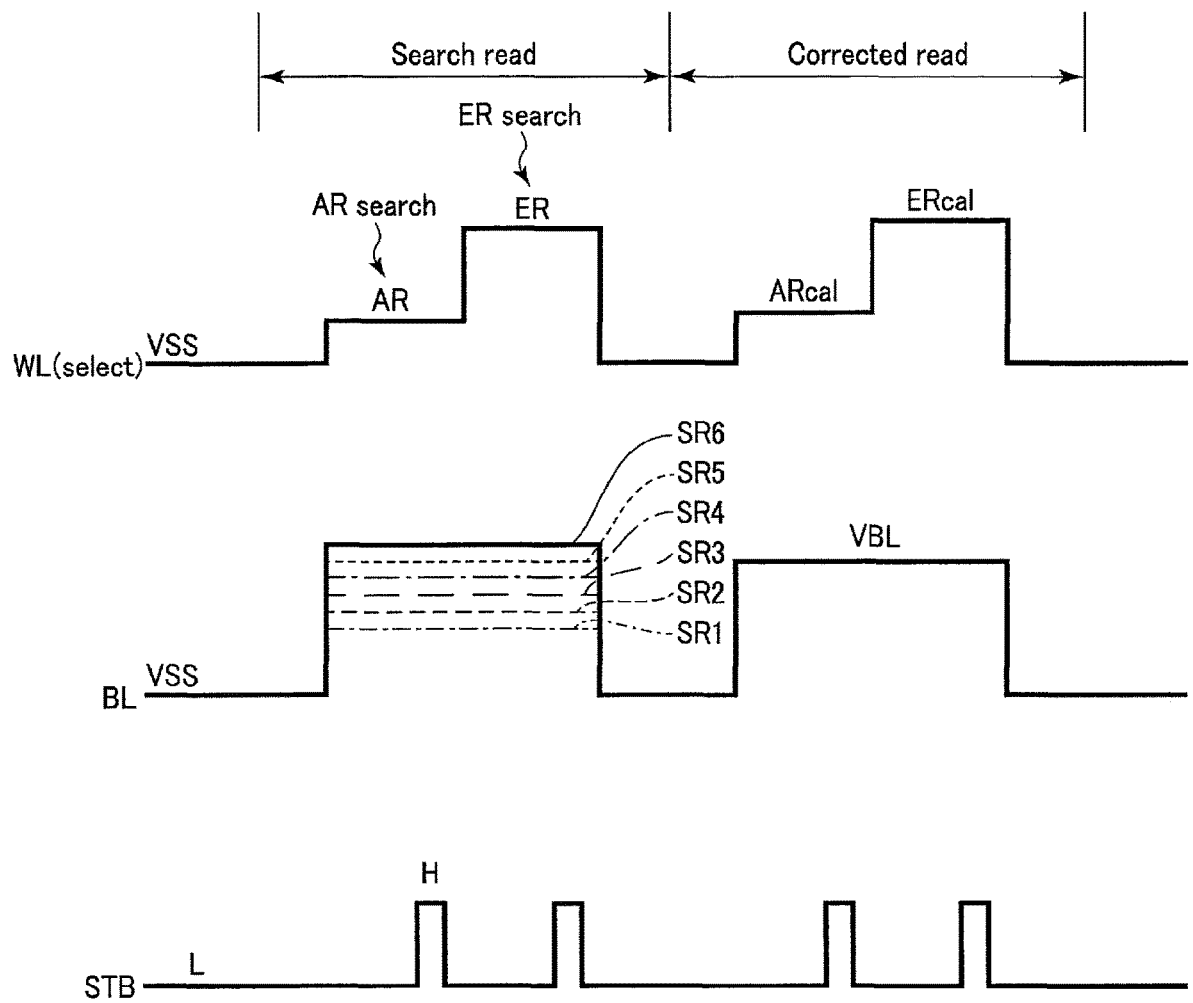
FIG. 17 is a diagram illustrating examples of voltages applied to various interconnects during a read operation of a semiconductor memory device according to a sixth embodiment.

FIG. 17 illustrates examples of voltages applied to the word line WL and the bit lines BL, respectively, and a variation in the control signal STB, in the search read and the corrected read of the semiconductor memory device 10 according to the sixth embodiment. FIG. 17 corresponds to an example of the application of the batch read for a plurality of levels described in the first embodiment to the search read described using FIG. 16.

In the search read, the semiconductor memory device 10 according to the sixth embodiment classifies the bit lines BL connected to the read target memory cell transistors MT, for example, into six groups. The numbers of bit lines BL in the first to sixth groups resulting from the classification are, for example, set to approximately the same value. The number of the groups into which the bit lines BL are divided is not limited to this and may be set to any value.

When the search read is started, first, the sequencer 17 executes a search read corresponding to the read voltage AR (AR search) as illustrated in FIG. 17. Specifically, the sense amplifier module 12 applies voltages SR1, SR2, SR3, SR4, SR5, and SR6 to the bit lines BL corresponding to the first group, the second group, the third group, the fourth group, the fifth group, and the sixth group. The relationship among the these voltage values is SR1<SR2<SR3<SR4<SR5<SR6 and SR1<VBL<SR6.

Specifically, the difference between the voltage SR1 and the read voltage AR is set to correspond to the difference between the voltage VBL and the search read voltage ARs6 and to correspond to the difference between the voltage VBL and the search read voltage ERs6. The difference between the voltage SR2 and the read voltage AR is set to correspond to the difference between the voltage VBL and the search read voltage ARs5 and to correspond to the difference between the voltage VBL and the search read voltage ERs5. The difference between the voltage SR3 and the read voltage AR is set to correspond to the difference between the voltage VBL and the search read voltage ARs4 and to correspond to the difference between the voltage VBL and the search read voltage ERs4. The difference between the voltage SR4 and the read voltage AR is set to correspond to the difference between the voltage VBL and the search read voltage ARs3 and to correspond to the difference between the voltage VBL and the search read voltage ERs3. The difference between the voltage SR5 and the read voltage AR is set to correspond to the difference between the voltage VBL and the search read voltage ARs2 and to correspond to the difference between the voltage VBL and the search read voltage ERs2. The difference between the voltage SR6 and the read voltage AR is set to correspond to the difference between the voltage VBL and the search read voltage ARs1 and to correspond to the difference between the voltage VBL and the search read voltage ERs1.

The row decoder 13 applies the read voltage AR to the selected word line WL. The sequencer 17 asserts the control signal STB while the read voltage AR is being applied. When the control signal STB is asserted, the sense amplifier units SAU connected to the bit lines BL in the first group hold, in the internal latch circuits thereof, read results similar to the results of read using the search read voltage ARs6 described using FIG. 16.

Similarly, the sense amplifier units SAU connected to the bit lines BL in the second to sixth groups hold, in the internal latch circuits thereof, read results similar to the results of read using the search read voltages ARs5 to ARs1, respectively.

Then, the sequencer 17 calculates the corrected read voltage ARcal based on read results similar to the results of read using each of the search read voltages ARs1 to ARs6.

The sequencer 17 then executes a search read corresponding to the read voltage ER (ER search). Specifically, the row decoder 13 applies the read voltage ER to the selected word line WL. The sequencer 17 asserts the control signal STB while the read voltage AR is being applied. When the control signal STB is asserted, the sense amplifier units SAU connected to the bit lines BL in the first group hold, in the internal latch circuits thereof, read results similar to the results of read using the search read voltage ERs6 described using FIG. 16.

Similarly, the sense amplifier units SAU connected to the bit lines BL in the second to sixth groups hold, in the internal latch circuits thereof, read results similar to the results of read using the search read voltages ERs5 to ERs1, respectively.

Then, the sequencer 17 calculates the corrected read voltage ERcal based on read results similar to the results of read using each of the search read voltages ERs1 to ERs6.

When the corrected read voltage ARcal corresponding to the read voltage AR that has been corrected and the corrected read voltage ERcal corresponding to the read voltage AR that has been corrected are calculated as described above, for example, the sequencer 17 then executes a corrected read. The corrected read of the semiconductor memory device 10 according to the sixth embodiment using FIG. 17 is similar to the corrected read described using 16, and thus, description thereof is omitted.

[6-2] Effects of the Sixth Embodiment

As described above, in the search read described using the FIG. 17, the semiconductor memory device 10 according to the sixth embodiment classifies the bit lines BL into any number of groups and performs different batch reads corresponding to the respective search read voltages. In this case, the number of results of read with each search read voltage decreases consistently with the number of groups resulting from the classification.

In contrast, for the semiconductor memory device 10 according to the sixth embodiment, the assumption is made that threshold distributions defined by the memory cell transistors MT corresponding to the groups into which the bit lines BL are divided are similar to the original threshold distributions, not subjected to the classification yet.

This is because the data written into each page is typically randomized by the external memory controller, with the result that the numbers of memory cell transistors MT corresponding to the respective levels in the page are considered to be uniform.

As a result, in the search read described using FIG. 17, the semiconductor memory device 10 according to the sixth embodiment can calculate the optimal corrected value for the read voltage from the results of the batch read corresponding to each search read voltage.

In other words, by executing the search read described using FIG. 17, the semiconductor memory device 10 according to the sixth embodiment can reduce each of the number of types of voltages applied and the number of assertions of the control signal STB below the number in the search read described using FIG. 16.

Consequently, the semiconductor memory device 10 according to the sixth embodiment can reduce the time needed for the search read. Therefore, the semiconductor memory device 10 according to the sixth embodiment can reduce the time needed for re-reading in the read operation, allowing a faster read operation to be achieved.

7 Seventh Embodiment

A semiconductor memory device 10 according to a seventh embodiment is configured similarly to the semiconductor memory device 10 according to the first embodiment. The semiconductor memory device 10 according to the seventh embodiment executes a search read similar to the search read in the sixth embodiment, with the voltage of the word line WL fixed.

[7-1] Operation

Figure 18:
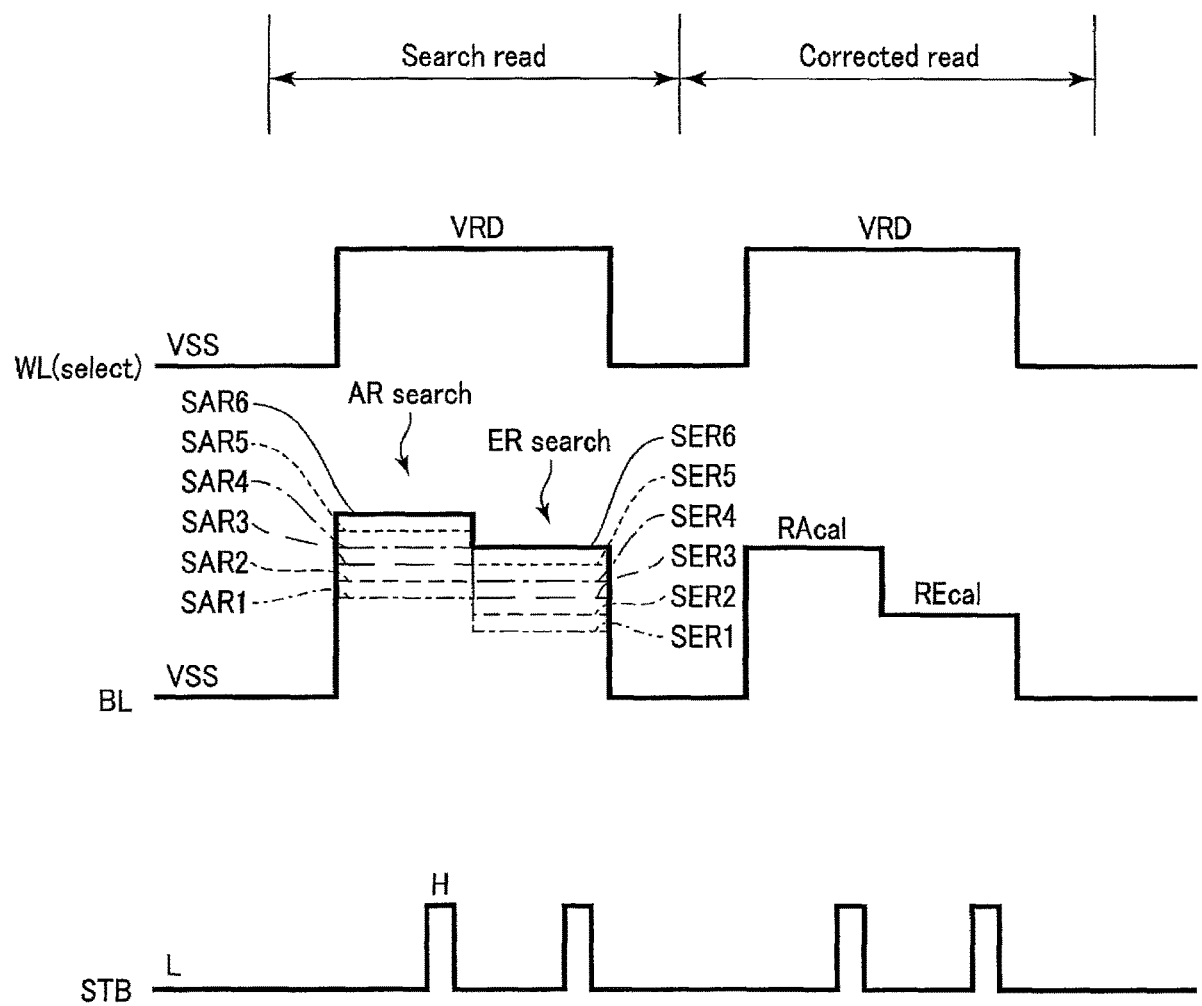
FIG. 18 is a diagram illustrating examples of voltages applied to various interconnects during a read operation of a semiconductor memory device according to a seventh embodiment.

FIG. 18 illustrates examples of voltages applied to the word line WL and the bit lines BL, respectively, and a variation in the control signal STB, in the search read and the corrected read of the semiconductor memory device 10 according to the seventh embodiment. FIG. 18 corresponds to an example of a case where the voltage of the word line WL is fixed for the search read described using FIG. 17.

When the search read is started, first, the sequencer 17 executes a search read corresponding to the read voltage AR (AR search) as illustrated in FIG. 18.

Specifically, the row decoder 13 applies a voltage VRD to the selected word line WL. The voltage VRD is a read voltage used as a reference for the read operation in the seventh embodiment, and may be set to any value. For example, the read target CR is used as the voltage VRD.

The sense amplifier module 12 applies voltages SAR1, SAR2, SAR3, SAR4, SAR5, and SAR6 to the bit lines BL corresponding to the first group, the second group, the third group, the fourth group, the fifth group, and the sixth group, respectively. The relationship among these voltage values is SAR1<SAR2<SAR3<SAR4<SAR5<SAR6 and SAR1<VBL<SAR6.

Specifically, the difference between the voltage SAR1 and the read voltage VRD is set to correspond to the difference between the voltage VBL and the search read voltage ARs6. The difference between the voltage SAR2 and the read voltage VRD is set to correspond to the difference between the voltage VBL and the search read voltage ARs5. The difference between the voltage SAR3 and the read voltage VRD is set to correspond to the difference between the voltage VBL and the search read voltage ARs4. The difference between the voltage SAR4 and the read voltage VRD is set to correspond to the difference between the voltage VBL and the search read voltage ARs3. The difference between the voltage SAR5 and the read voltage VRD is set to correspond to the difference between the voltage VBL and the search read voltage ARs2. The difference between the voltage SAR6 and the read voltage VRD is set to correspond to the difference between the voltage VBL and the search read voltage ARs1.

The sequencer 17 asserts the control signal STB while each of the voltages SAR1 to SAR6 is being applied. When the control signal STB is asserted, the sense amplifier units SAU connected to the bit lines BL in the first group hold, in the internal latch circuits thereof, read results similar to the results of read using the search read voltage ARs6 described using FIG. 16.

Similarly, the sense amplifier units SAU connected to the bit lines BL in the second to sixth groups hold, in the internal latch circuits thereof, read results similar to the results of read using the search read voltages ARs5 to ARs1, respectively.

Then, the sequencer 17 calculates a corrected voltage RAcal based on read results similar to the results of read using each of the search read voltages ARs1 to ARs6. The corrected voltage RAcal is such that, for example, the difference between the corrected voltage RAcal and the voltage VRD corresponds to the difference between the voltage VBL and the corrected read target ARcal described using FIG. 17.

The sequencer 17 then executes a search read corresponding to the read voltage ER (ER search). Specifically, the sense amplifier module 12 applies voltages SER1, SER2, SER3, SER4, SER5, and SER6 to the bit lines BL corresponding to the first group, the second group, the third group, the fourth group, the fifth group, and the sixth group, respectively. The relationship among these voltage values is SER1<SER2<SER3<SER4<SER5<SER6 and SER1<VBL<SER6.

Specifically, the difference between the voltage SER1 and the read voltage VRD is set to correspond to the difference between the voltage VBL and the search read voltage ERs6. The difference between the voltage SER2 and the read voltage VRD is set to correspond to the difference between the voltage VBL and the search read voltage ERs5. The difference between the voltage SER3 and the read voltage VRD is set to correspond to the difference between the voltage VBL and the search read voltage ERs4. The difference between the voltage SER4 and the read voltage VRD is set to correspond to the difference between the voltage VBL and the search read voltage ERs3. The difference between the voltage SER5 and the read voltage VRD is set to correspond to the difference between the voltage VBL and the search read voltage ERs2. The difference between the voltage SER6 and the read voltage VRD is set to correspond to the difference between the voltage VBL and the search read voltage ERs1.

The sequencer 17 asserts the control signal STB while each of the voltages SER1 to SER6 is being applied. When the control signal STB is asserted, the sense amplifier units SAU connected to the bit lines BL in the first group hold, in the internal latch circuits thereof, read results similar to the results of read using the search read voltage ERs6 described using FIG. 16.

Similarly, the sense amplifier units SAU connected to the bit lines BL in the second to sixth groups hold, in the internal latch circuits thereof, read results similar to the results of read using the search read voltages ERs5 to ERs1, respectively.

Then, the sequencer 17 calculates a corrected voltage REcal based on read results similar to the results of read using each of the search read voltages ERs1 to ERs6. The corrected voltage REcal is such that, for example, the difference between the corrected voltage REcal and the voltage VRD corresponds to the difference between the voltage VBL and the corrected read target ERcal described using FIG. 17.

When the corrected voltage RAcal corresponding to the corrected read voltage ARcal and the corrected voltage REcal corresponding to the corrected read voltage ERcal are calculated as described above, for example, the sequencer 17 then executes a corrected read.

In the corrected read, the row decoder 13 applies the voltage VRD to the selected word line WL. The sense amplifier module 12, for example, applies the corrected voltages RAcal and REcal to each read target bit line BL in this order. The sequencer 17 asserts the control signal STB while each of the corrected voltages RAcal and REcal is being applied. When the control signal STB is asserted, the sense amplifier module 12 holds, in the latch circuits therein, read results similar to the results of read using the corrected read voltages ARcal and ERcal described using FIG. 17.

In the seventh embodiment, the voltage VRD used for the search read may be different from the voltage VRD used for the corrected read. Different voltages may be used so long as the same relationship is established between the voltage applied to the selected word line WL and the applied bit line BL voltage corresponding to each group.

[7-2] Effects of the Seventh Embodiment

As described above, for the search read and the corrected read described in the sixth embodiment using FIG. 17, the semiconductor memory device 10 according to the seventh embodiment varies the voltage of each bit line BL instead of fixing the voltage applied to the selected word line WL.

Also in such a case, the semiconductor memory device 10 according to the seventh embodiment can produce read results similar to the results of the search read described in the sixth embodiment. In other words, in the search read described using FIG. 18, the semiconductor memory device 10 according to the seventh embodiment can calculate the optimal corrected value for the read voltage from the results of the batch read corresponding to each search read voltage.

Consequently, like the semiconductor memory device according to the sixth embodiment, the semiconductor memory device according to the seventh embodiment can reduce the time needed for the search read. Therefore, like the semiconductor memory device according to the sixth embodiment, the semiconductor memory device according to the seventh embodiment can reduce the time for re-reading during the read operation and can thus achieve a faster read operation.

The semiconductor memory device 10 may combine the search read described in the sixth embodiment using FIG. 17 with the search read described in the seventh embodiment using FIG. 18. In this case, the semiconductor memory device 10 executes, as the search read, a read involving varying the voltage of the word line WL with the voltage of each bit line BL fixed, and executes, as the corrected read, a read involving varying the voltage of each bit line BL with the voltage of the word line WL fixed.

Similarly, the semiconductor memory device 10 may combine the search read described in the seventh embodiment using FIG. 18 with the search read described in the sixth embodiment using FIG. 17. In this case, the semiconductor memory device 10 executes, as the search read, a read involving varying the voltage of each bit line BL with the voltage of the word line WL fixed, and executes, as the corrected read, a read involving varying the voltage of the word line WL with the voltage of each bit line BL fixed.

Alternatively, the semiconductor memory device 10 may perform a read operation similar to the verify operation described in the fifth embodiment using FIG. 13. In this case, in the search read, the semiconductor memory device 10 applies two types of word line WL voltages and two types of bit line BL voltages corresponding to the respective types of word line WL voltages. The sequencer 17 asserts the control signal STB while each of the sets of one of the word line WL voltages and the corresponding one of the bit line BL voltages is being applied.

8 Eighth Embodiment

A semiconductor memory device 10 according to an eighth embodiment is configured similarly to the semiconductor memory device 10 according to the first embodiment. In regard to the search read described in the sixth embodiment, the semiconductor memory device 10 according to the eighth embodiment utilizes a corrected value for the read voltage resulting from search read for one level to calculate a corrected value for the read voltage for another level.

[8-1] Operation

Figure 19:
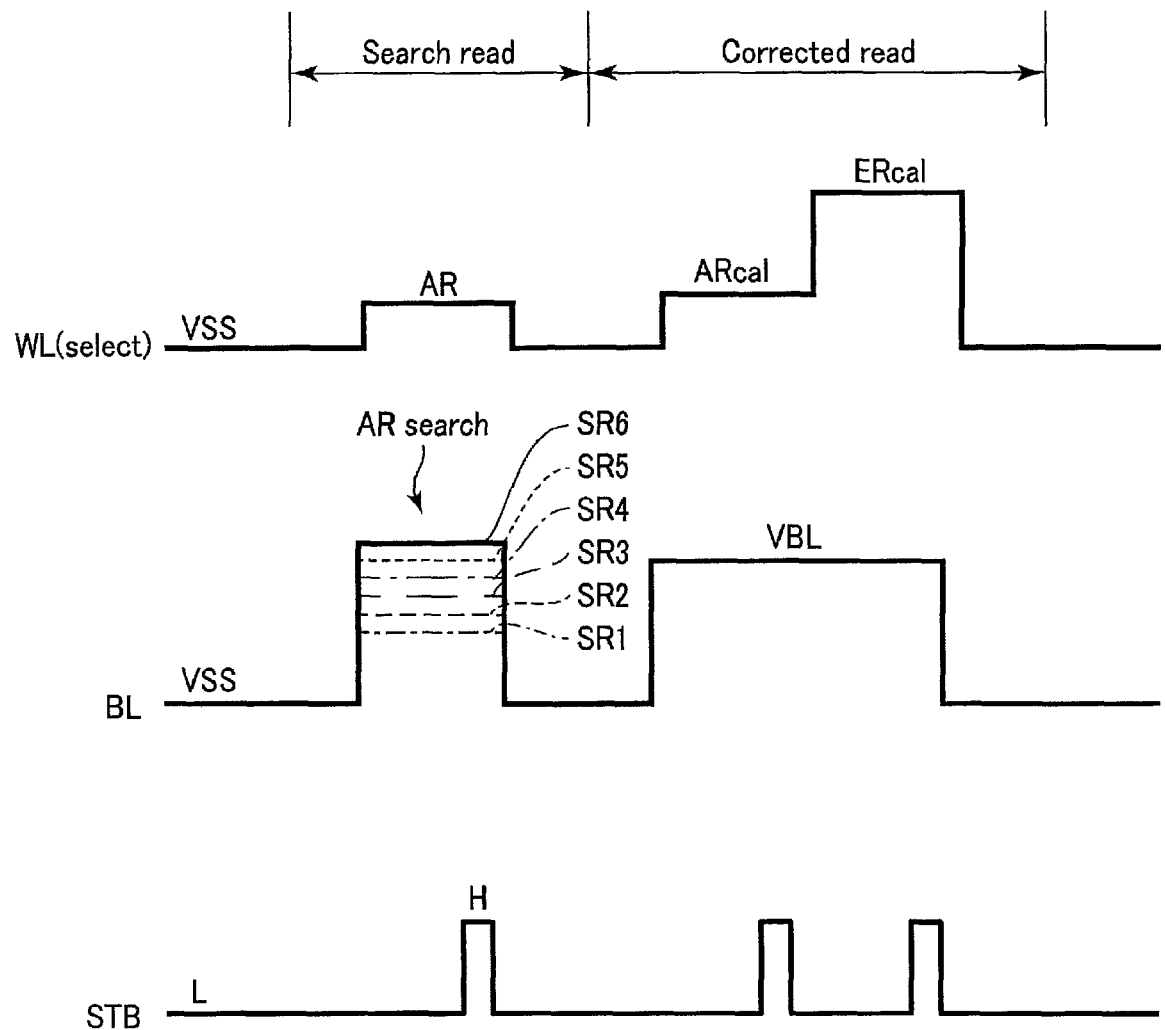
FIG. 19 is a diagram illustrating examples of voltages applied to various interconnects during a read operation of a semiconductor memory device according to an eighth embodiment.

FIG. 19 illustrates examples of voltages applied to the word line WL and the bit lines BL, respectively, and a variation in the control signal STB, in the search read and the corrected read of the semiconductor memory device 10 according to the eighth embodiment. FIG. 19 is similar to FIG. 17 except that the ER search is omitted from the search read described using FIG. 17.

Specifically, first, the sequencer 17 executes a search read corresponding to the read voltage AR (AR search) as illustrated in FIG. 19. The details of the search read are similar to the details of the search read in the sixth embodiment described using FIG. 17, and the search read results in calculation of the corrected read voltage ARcal.

Then, the sequencer 17 calculates the corrected read voltage ERcal based on the corrected value applied to the corrected read voltage ARcal. As the corrected value applied to the corrected read voltage ERcal, the same corrected value as that applied to the corrected read voltage ARcal may be applied or a corrected value calculated using a function based on the relationship between the read voltages AR and ER may be applied.

When the corrected read voltage ARcal corresponding to the read voltage AR that has been corrected and the corrected read voltage ERcal corresponding to the read voltage ER that has been corrected are calculated as described above, for example, the sequencer 17 then executes a corrected read. The details of this corrected read are similar to the details of the corrected read described using FIG. 17, and thus, description thereof is omitted.

[8-2] Effects of the Eighth Embodiment

As described above, in regard to the search read described in the sixth embodiment using FIG. 17, the semiconductor memory device 10 according to the eighth embodiment calculates, from the results of search read for one level, a corrected value for the optimal read voltage for another level.

Also in such a case, the semiconductor memory device 10 according to the eighth embodiment can provide a corrected value similar to that in the search read described in the sixth embodiment. In other words, the semiconductor memory device 10 according to the eighth embodiment can reduce the time for the search read as a result of omission of the level for execution of the search read.

Therefore, the semiconductor memory device 10 according to the eighth embodiment can reduce the time for re-reading during the read operation and can thus achieve a faster read operation, compared to the semiconductor memory device 10 according to the sixth embodiment.

9 Ninth Embodiment

A semiconductor memory device 10 according to a ninth embodiment is configured similarly to the semiconductor memory device 10 according to the first embodiment. In regard to the search read described in the seventh embodiment, the semiconductor memory device 10 according to the ninth embodiment utilizes a corrected value for the bit line voltage resulting from search read for one level to calculate a corrected value for the bit line voltage for other level.

[9-1] Operation

FIG. 20 illustrates examples of voltages applied to the word line WL and the bit lines BL, respectively, and a variation in the control signal STB, in the search read and the corrected read of the semiconductor memory device 10 according to the ninth embodiment. FIG. 20 is similar to FIG. 18 except that the ER search is omitted from the search read described using FIG. 18.

Specifically, first, the sequencer 17 executes a search read corresponding to the read voltage AR (AR search) as illustrated in FIG. 20. The details of the search read are similar to the details of the search read in the seventh embodiment described using FIG. 18, and the search read results in calculation of the corrected voltage RAcal.

Then, the sequencer 17 calculates the corrected voltage REcal based on the corrected value applied to the corrected voltage RAcal. As the corrected value applied to the corrected read voltage REcal, the same corrected value as that applied to the corrected voltage RAcal may be applied or a corrected value calculated using a function based on the relationship between the read voltages AR and ER may be applied.

When the corrected read voltage ARcal corresponding to the read voltage AR that has been corrected and the corrected read voltage ERcal corresponding to the read voltage ER that has been corrected are calculated as described above, for example, the sequencer 17 then executes a corrected read. The details of this corrected read are similar to the details of the corrected read described using FIG. 18, and thus, description thereof is omitted.

[9-2] Effects of the Ninth Embodiment

As described above, in regard to the corrected read described in the eighth embodiment using FIG. 19, the semiconductor memory device 10 according to the ninth embodiment performs a read involving varying the voltage of the word line WL with the voltage of each bit line BL fixed.

Also in such a case, the semiconductor memory device 10 according to the ninth embodiment can produce effects similar to those of the corrected read described in the eighth embodiment. In other words, the semiconductor memory device 10 according to the ninth embodiment can produce effects similar to those of the semiconductor memory device 10 according to the eighth embodiment and can thus achieve a faster read operation.

10 Modification and the Like

The semiconductor memory device 10 of the embodiments includes a plurality of memory cells <FIG. 2, MT>, a word line <FIG. 2, WL>, a plurality of bit lines BL <FIG. 2, BL>, and a controller <FIG. 1, 17>. Each of the plurality of memory cells stores a plurality of bits of data based on a threshold voltage. The plurality of memory cells is set to have a first threshold voltage <FIG. 3, for example, the "A" level> in a case of storing first data as the plurality of bits of data, set to have a second threshold voltage <FIG. 3, for example, the "B" level> higher than the first threshold voltage in a case of storing second data as the plurality of bits of data, and set to have a third threshold voltage <FIG. 3, for example, the "C" level> higher than the second threshold voltage in a case of storing third data as the plurality of bits of data. The word line is connected to a plurality of the memory cells. Each of the plurality of bit lines is connected to a plurality of the memory cells. The controller performs a write including a program loop including a program operation. In the program operation, while applying a program voltage <FIG. 6, VPGM> to the word line, the controller applies a first voltage (FIG. 6, PA) to bit lines connected to memory cells to which the first data is to be written, applies a second voltage <FIG. 6, PB> lower than the first voltage to bit lines connected to memory cells to which the second data is to be written, and applies a third voltage <FIG. 6, PC> lower than the second voltage to bit lines connected to memory cells to which the third data is to be written. Consequently, the semiconductor memory device 10 can achieve a faster write operation.

The write operation using the QPW method described in the second embodiment can be applied to a case where one memory cell transistor MT stores 3 or more bits of data. For example, as described in the third embodiment, the QPW method can be applied to the write operation in which the TLC method is applied as a write method. In this case, the semiconductor memory device 10 executes each of the "VL" verify and the "VH" verify corresponding to each level. The semiconductor memory device 10 then adjusts the voltages applied to the bit lines BL based on the verify results to allow the threshold distributions to be narrowed as is the case with the second embodiment.

In the double pulse-based write operation described in the fourth embodiment, the memory cell transistors MT in the second group with the higher threshold voltage may be set as write targets when a write is executed on the memory cell transistors MT in the first group with the lower threshold voltage. The present modification will be described below using FIG. 21.

FIG. 21 illustrates examples of voltages applied to the word line WL and the bit lines BL, respectively, and a variation in the control signal STB, in a write operation of a semiconductor memory device 10 according to the modification of the fourth embodiment.

As illustrated in FIG. 21, the write operation in the modification of the fourth embodiment is different from the write operation in the fourth embodiment described using FIG. 12 in control of the "E" write, the "F" write, and the "G" write.

Specifically, in each program loop, while the row decoder 13 is applying the program voltage VPGM1 to the word line WL, the sense amplifier module 12 applies, for example, the voltage VSS to each of the "E" write, "F" write, and "G" write bit lines BL. At this time, different voltages may be applied to the "E" write, "F" write, and "G" write bit lines BL, respectively, and may be set to any values.

In such a case, if, for example, the memory cell transistors MT for each of the "E" write, the "F" write, and the "G" write have a low threshold voltage (for example, in the first program loop), application of the program voltage VPGM1 increases the threshold voltage of each of the corresponding memory cell transistors MT.

If the memory cell transistors MT for each of the "E" write, the "F" write, and the "G" write have a high threshold voltage, an increase in the threshold voltage of each of the corresponding memory cell transistors MT is suppressed or the threshold voltage is slightly increased.

Other operations included in the write operation in the modification of the fourth embodiment are similar to corresponding operations included in the write operation in the fourth embodiment described using FIG. 12, and thus, description thereof is omitted.

The write operation in the modification of the fourth embodiment described above allows exertion of effects similar to those of the write operation in the fourth embodiment. In other words, like the semiconductor memory device 10 according to the fourth embodiment, the semiconductor memory device 10 according to the modification of the fourth embodiment can improve the reliability of written data and can thus achieve a faster write operation.

In the above-described examples in the sixth to ninth embodiments, one page of data is obtained by the read operation with the read voltages AR and ER. However, the present invention is not limited to this. For example, the search read and the corrected read can be executed using other than the above-described combinations of the read voltages. Furthermore, the semiconductor memory device 10 can execute the search read and the corrected read for one read voltage.

In the above-described examples in the sixth to ninth embodiments, the semiconductor memory device 10 reads data from each page. However, the present invention is not limited to this. For example, the semiconductor memory device 10 may read a plurality of bits of data stored in the memory cell at a time. Also in such a case, the semiconductor memory device 10 can execute re-reading faster by applying the batch read to the search read corresponding to each level.

In the above-described embodiment, the read operation has been described using the timing charts indicating the waveform of the word line WL. The waveform of the word line WL is, for example, similar to the waveform of a signal line through which voltages are supplied to the row decoder 13. In other words, in the above-described embodiments, the voltage applied to the word line WL and the period of time when the voltage is applied to the word line WL can be roughly determined by checking the voltage of the corresponding signal line. In this case, the voltage of the word line WL may be lower than the voltage of the corresponding signal line due to a voltage drop caused by a transfer transistor included in the row decoder 13.

In the above-described examples in the embodiments, a MONOS film is used for the memory cell. However, the present invention is not limited to this. For example, even if memory cells each including a floating gate are used, similar effects can be produced by performing the read operation and the write operation described above in the embodiments.

The "connect" as used herein refers to electric connection of components and does not exclude interposition of another element between the components. Furthermore, the "off state" as used herein refers to application of a voltage lower than the threshold voltage of a transistor to a gate thereof, and does not exclude a flow of a minute current, such as, for example, a leakage current from the transistor.

In the embodiments according to the present invention:

(1) The voltage applied to the word line selected for the read operation at the "A"-level may be, for example, 0 V to 0.55 V. The voltage is not limited thereto, and may be 0.1 V to 0.24 V, 0.21 V to 0.31 V, 0.31 V to 0.4 V, 0.4 V to 0.5 V, or 0.5 V to 0.55 V.

The voltage applied to the word line selected for the read operation at the "B"-level is, for example, 1.5 V to 2.3 V. The voltage is not limited thereto, and may be 1.65 V to 1.8 V, 1.8 V to 1.95 V, 1.95 V to 2.1 V, or 2.1 V to 2.3 V.

The voltage applied to the word line selected for the read operation at the "C"-level is, for example, 3.0 V to 4.0 V. The voltage is not limited thereto, and may be 3.0 V to 3.2 V, 3.2 V to 3.4 V, 3.4 V to 3.5 V, 3.5 V to 3.6 V, or 3.6 V to 4.0 V.

The time (tR) for the read operation may be, for example, 25 μs to 38 μs, 38 μs to 70 μs, or 70 μs to 80 μs.

(2) The write operation includes the program operation and the verification operation as described above. In the write operation, the voltage first applied to the word line selected for the program operation may be, for example, 13.7 V to 14.3 V. The voltage is not limited thereto, and may be 13.7 V to 14.0 V or 14.0 V to 14.6 V.

The voltage first applied to the selected word line in the writing into an odd word line, and the voltage first applied to the selected word line in the writing into an even word line may be changed.

When the program operation is an incremental step pulse program (ISPP) type, a step-up voltage is, for example, about 0.5.

The voltage applied to the unselected word line may be, for example, 6.0 V to 7.3 V. The voltage is not limited thereto, and may be, for example, 7.3 V to 8.4 V or may be 6.0 V or less.

The pass voltage to be applied may be changed depending on whether the unselected word line is an odd word line or an even word line.

The time (tProg) for the write operation may be, for example, 1700 μs to 1800 μs, 1800 μs to 1900 μs, or 1900 μs to 2000 μs.

(3) In the erase operation, the voltage first applied to a well which is formed on the semiconductor substrate and over which the memory cells are arranged may be, for example, 12 V to 13.6 V. The voltage is not limited thereto, and may be, for example, 13.6 V to 14.8 V, 14.8 V to 19.0 V, 19.0 to 19.8 V, 19.8 V to 21 V.

The time (tErase) for the erase operation may be, for example, 3000 μs to 4000 μs, 4000 μs to 5000 μs, or 4000 μs to 9000 μs.

(4) The structure of the memory cell may have the charge storage layer disposed on the semiconductor substrate (silicon substrate) via a tunnel insulating film having a thickness of 4 to 10 nm. This charge storage layer may have a stacked structure including an insulating film of SiN or SiON having a thickness of 2 to 3 nm and polysilicon having a thickness of 3 to 8 nm. A metal such as Ru may be added to polysilicon. An insulating film is provided on the charge storage layer. This insulating film has, for example, a silicon oxide film having a thickness of 4 to 10 nm intervening between a lower high-k film having a thickness of 3 to 10 nm and an upper high-k film having a thickness of 3 to 10 nm. The high-k film includes, for example, HfO. The silicon oxide film can be greater in thickness than the high-k film. A control electrode having a thickness of 30 to 70 nm is formed on the insulating film via a material for work function adjustment having a thickness of 3 to 10 nm. Here, the material for work function adjustment includes a metal oxide film such as TaO or a metal nitride film such as TaN. W, for example, can be used for the control electrode.

An air gap can be formed between the memory cells.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a plurality of memory cells which include a first memory cell, a second memory cell, and a third memory cell, each configured to store a plurality of bits of data based on a threshold voltage and to be set to have a first threshold voltage in a case of storing first data as the plurality of bits of data, set to have a second threshold voltage higher than the first threshold voltage in a case of storing second data as the plurality of bits of data, and set to have a third threshold voltage higher than the second threshold voltage in a case of storing third data as the plurality of bits of data;
a word line connected to a plurality of the memory cells;
a plurality of bit lines which include a first bit line connected to the first memory cell, a second bit line connected to the second memory cell, and a third bit line connected to the third memory cell; and
a controller configured to perform a write operation including a plurality of program loops each including a program operation and a verify operation, wherein
the controller applies a first program voltage to the word line in the program operation in a first program loop included in the program loops, and
while applying the first program voltage,
applies a first voltage to the first bit line connected to memory cell to which the first data is to be written,
applies a second voltage lower than the first voltage to the second bit line connected to the second memory cell to which the second data is to be written, and applies a third voltage lower than the second voltage to the third bit line connected to the third memory cell to which the third data is to be written, wherein the controller applies, in the verify operation, a first verify voltage to the word line, and while applying the first verify voltage in the verify operation in the first program loop, applies a fourth voltage to the first bit line connected to the first memory cell to which the first data is to be written, applies a fifth voltage which is different from the fourth voltage to the second bit line connected to the second memory cell to which the second data is to be written, and applies a sixth voltage which is different from the fourth voltage and the fifth voltage to the third bit line connected to the third memory cell to which the third data is to be written, wherein the verify operation is executed for the first memory cell, the second memory cell, and the third memory cell concurrently.

2. The device of claim 1, wherein
the first program loop is an initial program loop in the write operation.

3. The device of claim 1, wherein
in the verify operation in the first program loop, the controller reads data stored in the plurality of memory cells while applying each of the fourth voltage, the fifth voltage, and the sixth voltage.

4. The device of claim 1, wherein
the controller classifies the memory cells to which the first data is to be written into a first group and a second group, and in the program operation in the first program loop, while applying the first program voltage, the controller applies the first voltage to bit lines connected to memory cells corresponding to the first group and applies a seventh voltage higher than the first voltage to bit lines connected to memory cells corresponding to the second group.

5. The device of claim 4, wherein
the controller classifies the memory cells to which the second data is to be written into a third group and a fourth group and classifies the memory cells to which the third data is to be written into a fifth group and a sixth group, and in the program operation in the first program loop, while applying the first program voltage, the controller applies the second voltage to bit lines connected to memory cells corresponding to the third group and included in the memory cells to which the second data is to be written and applies an eighth voltage higher than the first voltage to bit lines connected to memory cells corresponding to the fourth group and included in the memory cells to which the second data is to be written, and applies the third voltage to bit lines connected to memory cells corresponding to the fifth group and applies a ninth voltage higher than the third voltage and lower than the second voltage to bit lines connected to memory cells corresponding to the sixth group.

6. The device of claim 4, wherein
the verify voltage includes a first verify voltage and a second verify voltage, and in the verify operation in the first program loop, the controller reads data stored in the plurality of memory cells during application of each of the first verify voltage, the fourth voltage, the fifth voltage, and the sixth voltage and during application of each of the second verify voltage, the fourth voltage, and the fifth voltage.

7. The device of claim 4, wherein
data stored in the plurality of memory cells is read at two different timings respectively while each of the fourth voltage, the fifth voltage, and the sixth Voltage is being applied.

8. The device of claim 1, wherein
the plurality of memory cells further include a fourth memory cell, a fifth memory cell, a sixth memory cell, and a seventh memory cell, the plurality of bit lines further include a fourth bit line connected to the fourth memory cell, a fifth bit line connected to the fifth memory cell, a sixth bit line connected to the sixth memory cell, and a seventh bit line connected to the seventh memory cell, the plurality of memory cells each configured to be set to have a fourth threshold voltage higher than the third threshold voltage in a case of storing fourth data as the plurality of bits of data, set to have a fifth threshold voltage higher than the fourth threshold voltage in a case of storing fifth data as the plurality of bits of data, set to have a sixth threshold voltage higher than the fifth threshold voltage in a case of storing sixth data as the plurality of bits of data, and set to have a seventh threshold voltage higher than the sixth threshold voltage in a case of storing seventh data as the plurality of bits of data, and in the program operation in the first program loop,
while applying the first program voltage,
the controller applies a seventh voltage lower than the third voltage to the fourth bit line connected to the fourth memory cell to which the fourth data is to be written, applies an eighth voltage lower than the seventh voltage to the fifth bit line connected to the fifth memory cell to which the fifth data is to be written, applies a ninth voltage lower than the eighth voltage to the sixth bit line connected to the sixth memory cell to which the sixth data is to be written, and applies a tenth voltage lower than the ninth voltage to the seventh bit line connected to the seventh memory cell to which the seventh data is to be written.

9. The device of claim 8, wherein
the controller applies, in the verify operation in the first program loop, the first verify voltage to the word line, and while applying the first verify voltage in the verify operation in the first program loop, applies an eleventh voltage lower than the sixth voltage to the fourth bit line connected to the fourth memory cell to which the fourth data is to be written, applies a twelfth voltage lower than the eleventh voltage to the fifth bit line connected to the fifth memory cell to which the fifth data is to be written, applies a thirteenth voltage lower than the twelfth voltage to the sixth bit line connected to the sixth memory cell to which the sixth data is to be written, and applies a fourteenth voltage lower than the thirteenth voltage to the seventh bit line connected to the seventh memory cell to which the seventh data is to be written, wherein the verify operation is executed for the first memory cell, the second memory cell, the third memory cell, the fourth memory cell, the fifth memory cell, the sixth memory cell, and the seventh memory cell concurrently.

10. The device of claim 8, wherein
the controller consecutively applies, in the verify operation, the first verify voltage and a second verify voltage higher than the first verify voltage to the word line, and
while applying the second verify voltage in the verify operation in the first program loop,
applies an eleventh voltage to the fifth bit line connected to the fifth memory cell to which the fifth data is to be written, applies a twelfth voltage lower than the eleventh voltage to the sixth bit line connected to the sixth memory cell to which the sixth data is to be written, and applies a thirteenth voltage lower than the twelfth voltage to the seventh bit line connected to the seventh memory cell to which the seventh data is to be written.

11. The device of claim 10, wherein
in the verify operation in the first program loop, the controller applies a fourteenth voltage lower than the sixth voltage to the bit lines connected to the memory cells to which the fourth data is to be written while applying the verify voltage.

12. The device of claim 8, wherein
the write operation includes a first period, a second period succeeding the first period, and a third period succeeding the second period,
the controller applies the first verify voltage to the word line in the verify operation during the first period, consecutively applies the first verify voltage and a second verify voltage to the word line in the verify operation during the second period, and applies the second verify voltage to the word line in the verify operation during the third period, and
while applying the second verify voltage in the verify operation in the second program loop after the first program loop,
applies an eleventh voltage to the fifth bit line connected to the fifth memory cell to which the fifth data is to be written, applies a twelfth voltage lower than the eleventh voltage to the sixth bit line connected to the sixth memory cell to which the sixth data is to be written, and applies a thirteenth voltage lower than the twelfth voltage to the seventh bit line connected to the seventh memory cell to which the seventh data is to be written.

13. The device of claim 12, wherein
in the verify operation in the first program loop, the controller applies a fourteenth voltage lower than the sixth voltage to the fourth bit line connected to the fourth memory cell to which the fourth data is to be written, while applying the first verify voltage.

14. The device of claim 1, wherein
the plurality of memory cells further include a fourth memory cell, a fifth memory cell, and a sixth memory cell,
the plurality of bit lines further include a fourth bit line connected to the fourth memory cell, a fifth bit line connected to the fifth memory cell, and a sixth bit line connected to the sixth memory cell,
the plurality of memory cells each configured to be set to have a fourth threshold voltage higher than the third threshold voltage in a case of storing fourth data as the plurality of bits of data, set to have a fifth threshold voltage higher than the fourth threshold voltage in a case of storing fifth data as the plurality of bits of data, and set to have a sixth threshold voltage higher than the fifth threshold voltage in a case of storing sixth data as the plurality of bits of data,
in the program operation in the first program loop, the controller applies a second program voltage higher than the first program voltage after applying the first program voltage, and
while applying the second program voltage,
the controller applies a seventh voltage higher than the first voltage to each of the first bit line connected to the first memory cell to which the first data is to be written, the second bit line connected to the second memory cell to which the second data is to be written, and the third bit line connected to the third memory cell to which the third data is to be written,
applies an eighth voltage lower than the seventh voltage to fourth bit line connected to the fourth memory cell to which the fourth data is to be written,
applies a ninth voltage lower than the eighth voltage to fifth bit line connected to the fifth memory cell to which the fifth data is to be written, and
applies a tenth voltage lower than the ninth voltage to sixth bit line connected to the sixth memory cell to which the sixth data is to be written.

15. The device of claim 14, wherein
in the program operation in the first program loop, while applying the first program voltage,
the controller applies an eleventh voltage lower than the seventh voltage to each of the first bit line connected to the first memory cell to which the first data is to be written, the second bit line connected to the memory cell to which the second data is to be written, and the third bit line connected to the third memory cell to which the third data is to be written.

16. The device of claim 15, wherein
in the program operation in the first program loop, while applying the first program voltage,
the controller applies the seventh voltage to each of the fourth bit line connected to the fourth memory cell to which the fourth data is to be written, the fifth bit line connected to the fifth memory cell to which the fifth data is to be written, and the sixth bit line connected to the sixth memory cell to which the sixth data is to be written.

17. The device of claim 15, wherein
in the program operation in the first program loop, while applying the first program voltage,
the controller applies the eleventh voltage to each of the fourth bit line connected to the fourth memory cell to which the fourth data is to be written, the fifth bit line connected to the fifth memory cell to which the fifth data is to be written, and the sixth bit line connected to the sixth memory cell to which the sixth data is to be written.

18. The device of claim 15, wherein
the plurality of memory cells further include a seventh memory cell,
the plurality of bit lines further include a seventh bit line connected to the seventh memory cell,
the plurality of memory cells each configured to be set to have a seventh threshold voltage higher than the third threshold voltage and lower than the fourth threshold voltage in a case of storing seventh data as the plurality of bits of data, and
in the program operation in the first program loop, while applying the first program voltage, the controller applies a twelfth voltage lower than the third voltage to the seventh bit line connected to the seventh memory cell to which the seventh data is to be written, and while applying the second program voltage, applies the seventh voltage to the seventh bit line connected to the seventh memory cell to which the seventh data is to be written.

19. The device of claim 1, wherein the controller is configured to perform a read for the first to third threshold voltages concurrently while applying one voltage to the word line in the verify operation.

20. A semiconductor memory device comprising:

a plurality of memory cells which include a first memory cell, a second memory cell, and a third memory cell, each configured to store a plurality of bits of data based on a threshold voltage and to be set to have a first threshold voltage in a case of storing first data as the plurality of bits of data, set to have a second threshold voltage higher than the first threshold voltage in a case of storing second data as the plurality of bits of data, and set to have a third threshold voltage higher than the second threshold voltage in a case of storing third data as the plurality of bits of data;

a word line connected to a plurality of the memory cells;

a plurality of bit lines which include a first bit line connected to the first memory cell, a second bit line connected to the second memory cell, and a third bit line connected to the third memory cell; and a controller configured to perform a write operation including a plurality of program loops, each including a program operation and a verify operation, the controller configured to apply a first voltage to the first bit line, a second voltage to the second bit line, and a third voltage to the third bit line in the program operation in a first program loop included in the program loops, in the verify operation, apply a verify voltage to the word line, and while applying the verify voltage in the verify operation in the first program loop, apply a fourth voltage to the first bit line connected to the first memory cell to which the first data is to be written, apply a fifth voltage which is different from the fourth voltage to the second bit line connected to the second memory cell to which the second data is to be written, and apply a sixth voltage which is different from the fourth voltage and the fifth voltage to the third bit line connected to the third memory cell to which the third data is to be written, wherein the verify operation to the first memory cell, the second memory cell, and the third memory cell is executed concurrently.

* * * * *